United States Patent
Mielnik et al.

(10) Patent No.: US 12,369,267 B2
(45) Date of Patent: Jul. 22, 2025

(54) CARRIER MODULE APPARATUS FOR RETROFIT IN CONTROL CABINETS AND METHODS OF ASSEMBLY THEREOF

(71) Applicant: ABB Schweiz AG, Baden (CH)

(72) Inventors: David Mielnik, Painesville, OH (US); Richard Ogorek, Sagamore Hills, OH (US); Joachim Ruhe, Mentor, OH (US)

(73) Assignee: ABB Schweiz AG, Baden (CH)

( * ) Notice: Subject to any disclaimer, the term of this patent is extended or adjusted under 35 U.S.C. 154(b) by 627 days.

(21) Appl. No.: 17/708,762

(22) Filed: Mar. 30, 2022

(65) Prior Publication Data
US 2023/0320017 A1 Oct. 5, 2023

(51) Int. Cl.
- *G06F 1/16* (2006.01)
- *H05K 5/00* (2025.01)
- *H05K 7/00* (2006.01)
- *H05K 7/10* (2006.01)
- *H05K 7/14* (2006.01)

(52) U.S. Cl.
CPC ......... *H05K 7/1489* (2013.01); *H05K 7/1092* (2013.01); *H05K 7/1452* (2013.01); *H05K 7/103* (2013.01)

(58) Field of Classification Search
CPC .. H05K 7/1489; H05K 7/1092; H05K 7/1452; H05K 7/103
See application file for complete search history.

(56) References Cited

U.S. PATENT DOCUMENTS

| | | | |
|---|---|---|---|
| 5,984,734 A * | 11/1999 | Piper | H05K 7/1468 439/717 |
| 6,431,909 B1 * | 8/2002 | Nolden | H01R 9/2608 361/810 |
| 6,456,495 B1 * | 9/2002 | Wieloch | H05K 7/1477 361/801 |
| 7,516,927 B2 * | 4/2009 | Portal | H01R 9/2608 248/222.12 |
| 8,226,433 B1 * | 7/2012 | Correll | H01R 9/2608 439/532 |
| 8,472,194 B2 * | 6/2013 | Rivera Hernandez | H05K 7/209 361/710 |
| D735,667 S | 8/2015 | Mielnik et al. | |
| D765,031 S | 8/2016 | Mielnik et al. | |
| D766,182 S | 9/2016 | Mielnik et al. | |
| 9,454,140 B2 * | 9/2016 | Godau | H05K 7/1468 |
| D769,246 S | 10/2016 | Mielnik et al. | |
| 9,872,412 B2 | 1/2018 | Mielnik et al. | |
| 10,368,458 B2 | 7/2019 | Mielnik et al. | |
| 10,426,055 B2 | 9/2019 | Ross et al. | |
| 10,462,924 B2 | 10/2019 | Mielnik et al. | |
| 10,842,038 B2 | 11/2020 | Ross et al. | |
| 2004/0201972 A1 * | 10/2004 | Walesa | H05K 7/1484 361/788 |

(Continued)

*Primary Examiner* — Anthony M Haughton
(74) *Attorney, Agent, or Firm* — McCarter & English, LLP

(57) ABSTRACT

A carrier module assembly having a module removably attached to a carrier frame and a carrier riser. The carrier module assembly can be inserted into a slot of a control cabinet without having to re-wire or re-configure the control cabinet. The carrier module assembly has a length which enables the carrier module assembly to be located within the slot of the control cabinet. The module is removable from the carrier frame such that the module can be attached to a backplate of a rack.

17 Claims, 22 Drawing Sheets

(56) References Cited

U.S. PATENT DOCUMENTS

| | | | | |
|---|---|---|---|---|
| 2010/0268850 A1* | 10/2010 | Burton | ............ | G06F 13/409 |
| | | | | 710/3 |
| 2010/0314522 A1* | 12/2010 | Molnar | ............ | H02B 1/052 |
| | | | | 248/346.06 |
| 2013/0027890 A1* | 1/2013 | Berger | ............ | H05K 7/1468 |
| | | | | 361/747 |
| 2014/0199864 A1* | 7/2014 | Devanand | ............ | H01R 9/2608 |
| | | | | 439/116 |
| 2016/0041609 A1* | 2/2016 | Apro | ............ | H01R 13/5219 |
| | | | | 361/679.4 |
| 2021/0029844 A1 | 1/2021 | Ross et al. | | |

* cited by examiner

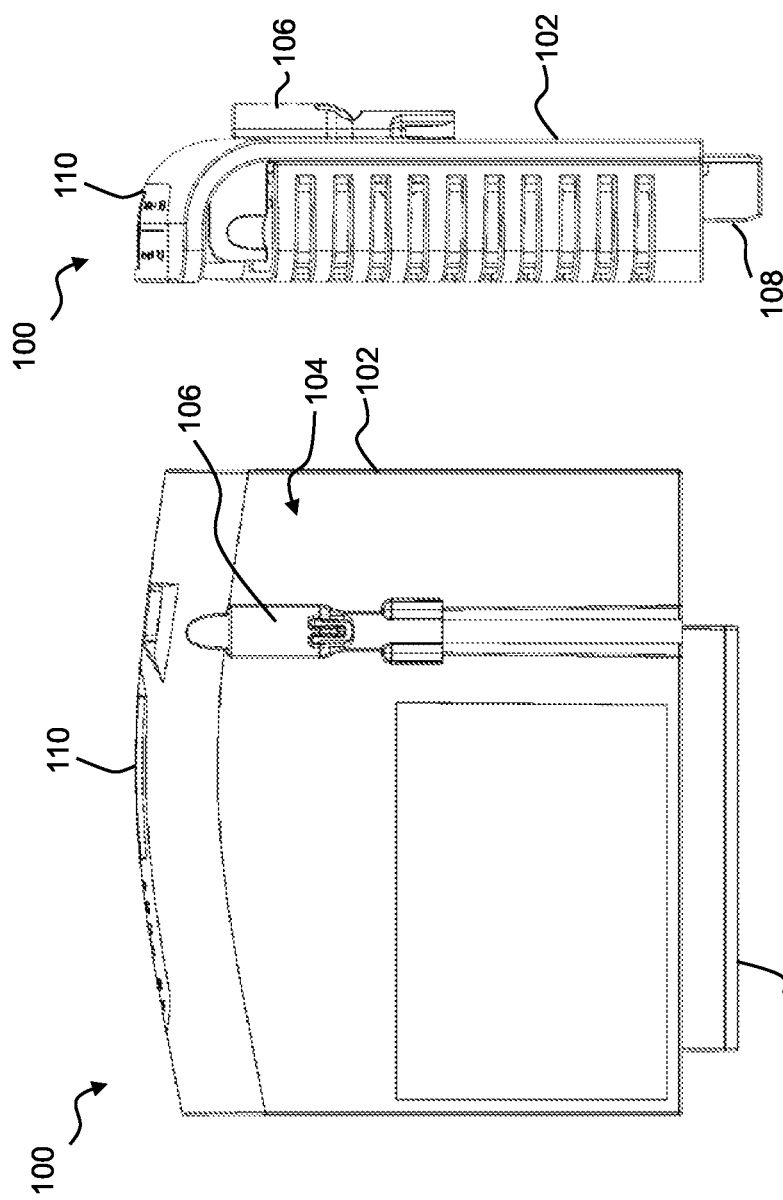

CARRIER MODULE APPARATUS FOR RETROFIT IN CONTROL CABINETS AND METHODS OF ASSEMBLY THEREOF

TECHNICAL FIELD

The present disclosure relates generally to a carrier module apparatus and retrofitting of systems that include the carrier module apparatus, and more particularly to carrier module apparatus and a method of retrofitting the carrier module apparatus into existing control cabinets.

BACKGROUND

Systems controllers are frequently used to monitor the operation of machines and systems. The system controllers may be comprised of a combination of modules, such as controller devices and I/O devices that are collectively arranged in mounting units or slots and the mounting units are in turn supported in a housing or cabinet for use in the field. The systems and machines include field devices that monitor the operation of the associated system/machine. The field devices, for example, may include temperature and pressure transmitters. Signal wiring connects the field devices to the controller devices and I/O devices of the system controller.

During use, the system controllers regularly receive signals that are transmitted from the field devices to the I/O devices of the mounting unit. The I/O devices in turn transmit the received signals to the one of the controller devices included in the associated mounting unit, and the controller devices processes the I/O device signals. The system controller transmits signals to the field device to initiate the required field device control actions.

The system controllers may be installed for use in remote field locations. The mounting unit performance degrades over time and as a result, the mounting units need to be repaired or replaced periodically. Because the system controllers are in remote locations, such as locations often referred to as 'brownfield locations', it is desirable to simplify the repair and replacement process, for example by limiting the number of potential replacement components in a controller system. As an example of the current repair complexities, a typical mounting unit contains ten I/O devices with sixteen channels per I/O device and two wires per channel, creating a total of 320 connection points. A typical controller cabinet contains eight of the typical mounting units totaling 2,560 individual wiring connections. Re-terminating these connections is a costly and time-consuming operation. Moreover, when new I/O devices and controller devices are installed they frequently cannot be reconnected to existing signal wiring. As a result, the installation of replacement signal wires compatible with the new components is required. New wiring requires that each wire be verified that it is connected correctly. Such a complex repair requires systems associated with the controller to be shut down while the controller is being repaired.

Therefore, there is a need to simplify the repair and replacement of controller devices and I/O devices in controller systems. More specifically, there is a need to repair or replace existing controller devices and I/O devices with modular assemblies that are compatible with and may be coupled to existing signal wiring.

SUMMARY

In one aspect, a carrier module assembly is disclosed. The carrier module comprises a module having an interface, a rear plug, and a side wall and a carrier frame having a socket adapter. The socket adapter has a first side portion and a second side portion, the first side portion configured to receive the rear plug of the module. The carrier module assembly further comprises a carrier riser having a front bus connector configured to interdigitate with the second side portion of the socket adapter and one or more of a bus port and a second bus connector.

In another aspect, a control cabinet is disclosed. The control cabinet comprises a backplate having openings defining a plurality of slots; at least one of a controller device or a I/O device disposed within a first slot of the plurality of slots; and at least one carrier module assembly disposed within a second slot of the plurality of slots. The at least one the carrier module assembly comprises a module having an interface, a rear plug, and a side wall; a carrier frame having a socket adapter, the socket adapter having a first side portion and a second side portion, the first side portion configured to receive the plug of the module; and, a carrier riser having a front bus connector configured to interdigitate with the second side portion of the socket adapter, and one or more of a bus port and a bus connector.

In yet another aspect, a method of retrofitting a carrier module assembly to a control cabinet is disclosed. The method comprises the steps of withdrawing a legacy device from a first slot of the control cabinet, the legacy device connected to a backplate of the control cabinet; inserting the carrier module assembly into the first slot. The controller assembly comprises a module having an interface, a plug, and a surface; a carrier frame having a socket adapter, the socket adapter having a first side portion and a second side portion, the first side portion configured to receive the plug of the module; and a carrier riser having a front bus connector configured to interdigitate with the second side portion of the socket adapter, and one or more of a bus port and a bus connector. The method further comprises the step of reconnecting the pin connector to the bus connector of the carrier riser of the carrier module assembly.

BRIEF DESCRIPTION OF THE DRAWINGS

The subject-matter of the disclosure will be explained in more detail in the following text with reference to exemplary embodiments which are illustrated in the attached drawings.

FIG. 4 illustrates a left side view of the module of FIG. 1.

FIG. 5 illustrates a top view of the module of FIG. 1.

FIG. 13.

The reference symbols used in the drawings, and their meanings, are listed in summary form in the list of reference symbols. In principle, identical parts are provided with the same reference symbols in the figures.

DETAILED DESCRIPTION

Figure 1:
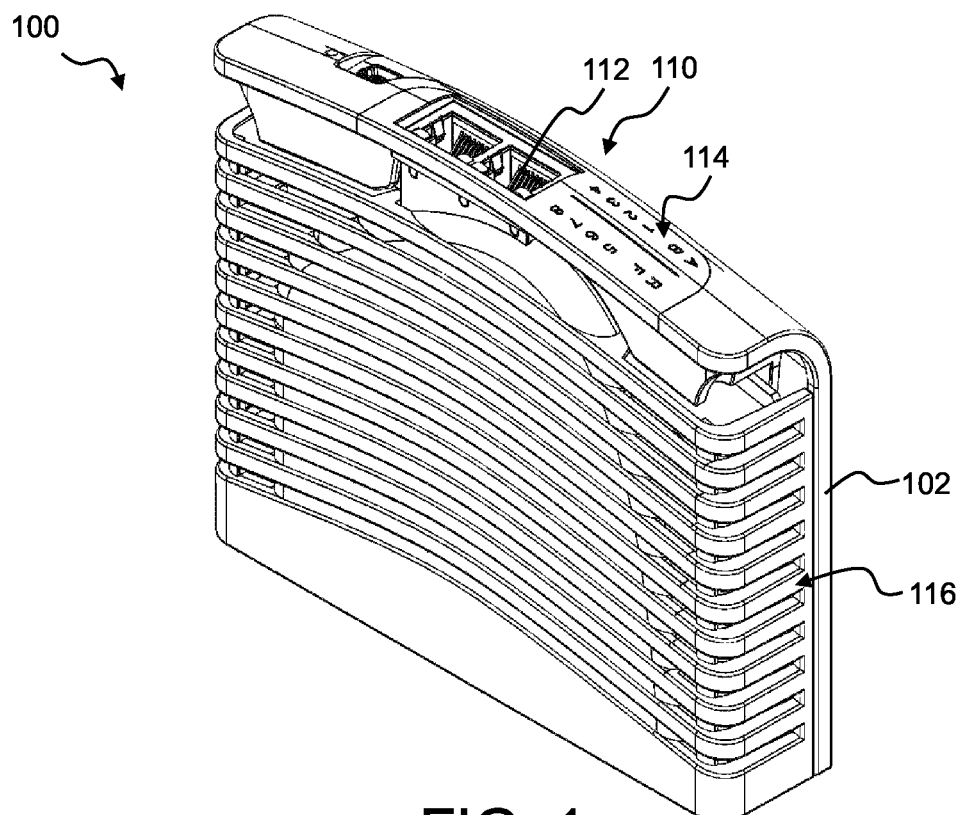
FIG. 1 illustrates a perspective view of a module in accordance with one or more embodiments of the present disclosure.

In the following specification and the claims, reference will be made to a number of terms, which shall be defined to have the following meanings.

As used herein, the singular forms "a," "an," and "the" include plural references unless the context clearly dictates otherwise. The terms "comprising," "including," and "having" are intended to be inclusive and mean that there may be additional elements other than the listed elements. The terms "optional" or "optionally" means that the subsequently described event or circumstance may or may not occur, and that the description includes instances where the event occurs and instances where it does not.

As used herein, the term "PCB" or "printed circuit board" as used in the present disclosure shall mean a substate to which electronic components are mounted and which conductive pathways or traces disposed on the substrate connect the electronic components.

As used herein, the term "legacy" and "existing" shall mean a device already installed in a commercial or industrial application. The legacy or existing device may still be functional or may require replacement. The legacy or existing device is compatible with the module of the present disclosure.

As used herein, the terms "connector," "bus connector," "bus port," "contacts," and "plug" refer to electrical contacts configured to transmit data or to supply low voltage power to modules or devices or the present disclosure. The contacts can be electroplated finger contacts on an edge of a printed circuit board which can interdigitate with a standoff connector of a different component. The contacts can also be a MOBUS pin connector. Each electroplated finger or pin can correspond to a bit. By way of example, a connector having sixteen fingers or pins can correspond to a 16-bit data transfer connection between components.

Embodiments of the present disclosure are directed to a carrier module assembly. The carrier module assembly comprises a carrier frame and a carrier riser. Modules can vary in size and form factor such that installation into conventional control cabinets requires re-wiring and installation time. The carrier module assembly is configured to accept the module such that the module can be fitted into conventional control cabinets without the need to re-wire or otherwise modify the carrier module assembly or the control cabinet. Thus, the carrier module assembly of the present disclosure is used to retrofit the module into control cabinets and control systems. The module is removable from the carrier module assembly such that the module can be re-used in control cabinets and racks having slots to directly receive the module.

With particular reference now to FIGS. 1 through 5, the module 100 includes a two-piece plastic housing 102 enclosing at least one printed circuit board (PCB not shown). The two-piece plastic housing 102 is cuboid in shape. The PCB includes a microprocessor, memory and other circuitry. The memory stores control programs that are executed by the microprocessor. The control programs may include one or more control loops, such as PID loops, which work on one or more field inputs to generate control outputs. In some embodiments, one piece of the two-piece plastic housing 102 includes a passive cooling element 116. In some embodiments, the passive cooling elements 116 that comprise slotted openings that enable passive airflow through the slotted openings and around the PCB, thereby cooling the printed circuit board and associated PCB components. See FIGS. 1 and 5. In some embodiments, the passive cooling elements 116 comprise aluminum fins or more generally metal fins which are connected to the PCB to conduct heat from the PCB and as a result dissipate heat from the PCB.

Figure 2:
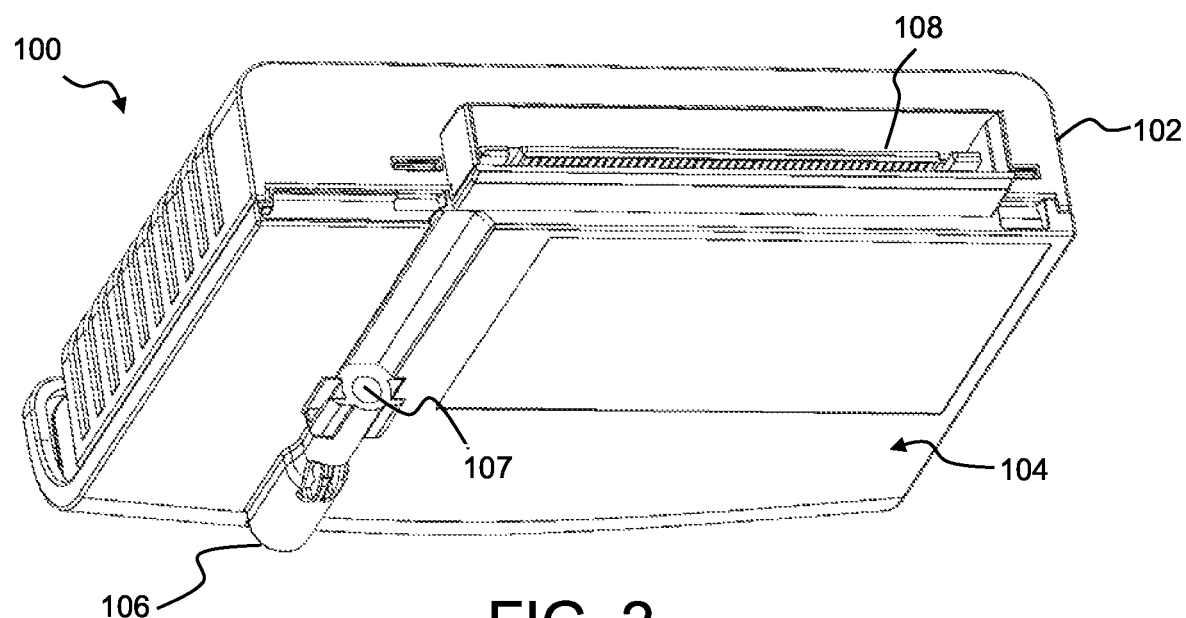
FIG. 2 illustrates a perspective view of the module of FIG. 1.
Figure 3:
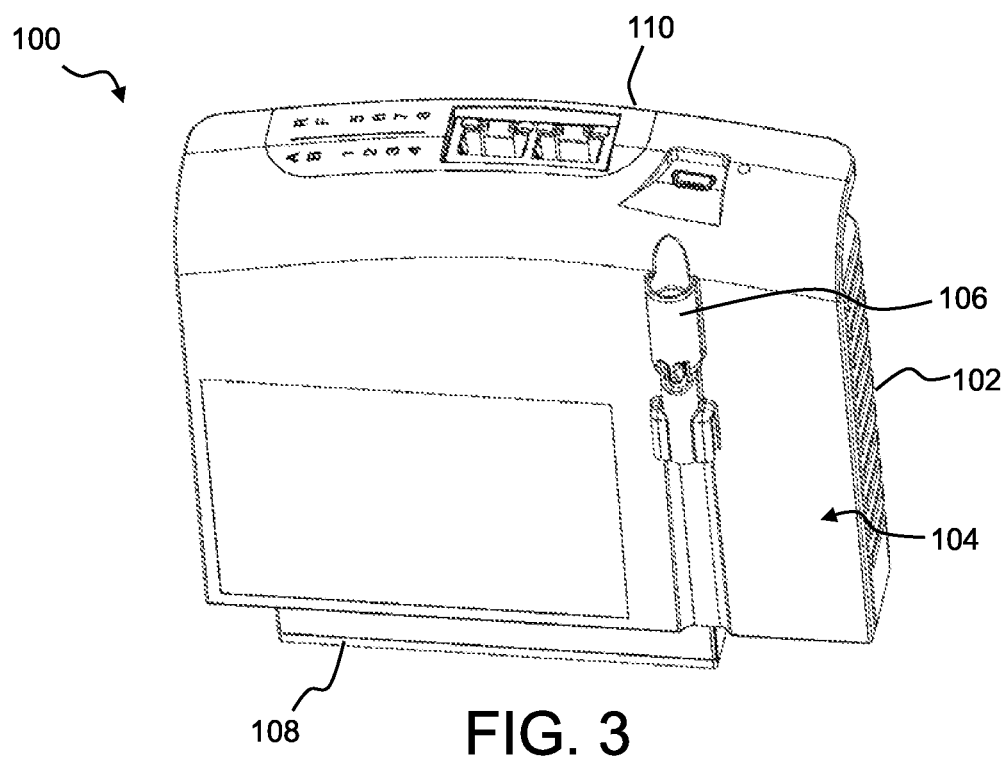
FIG. 3 illustrates a perspective view of the module of FIG. 1.
Figure 6:
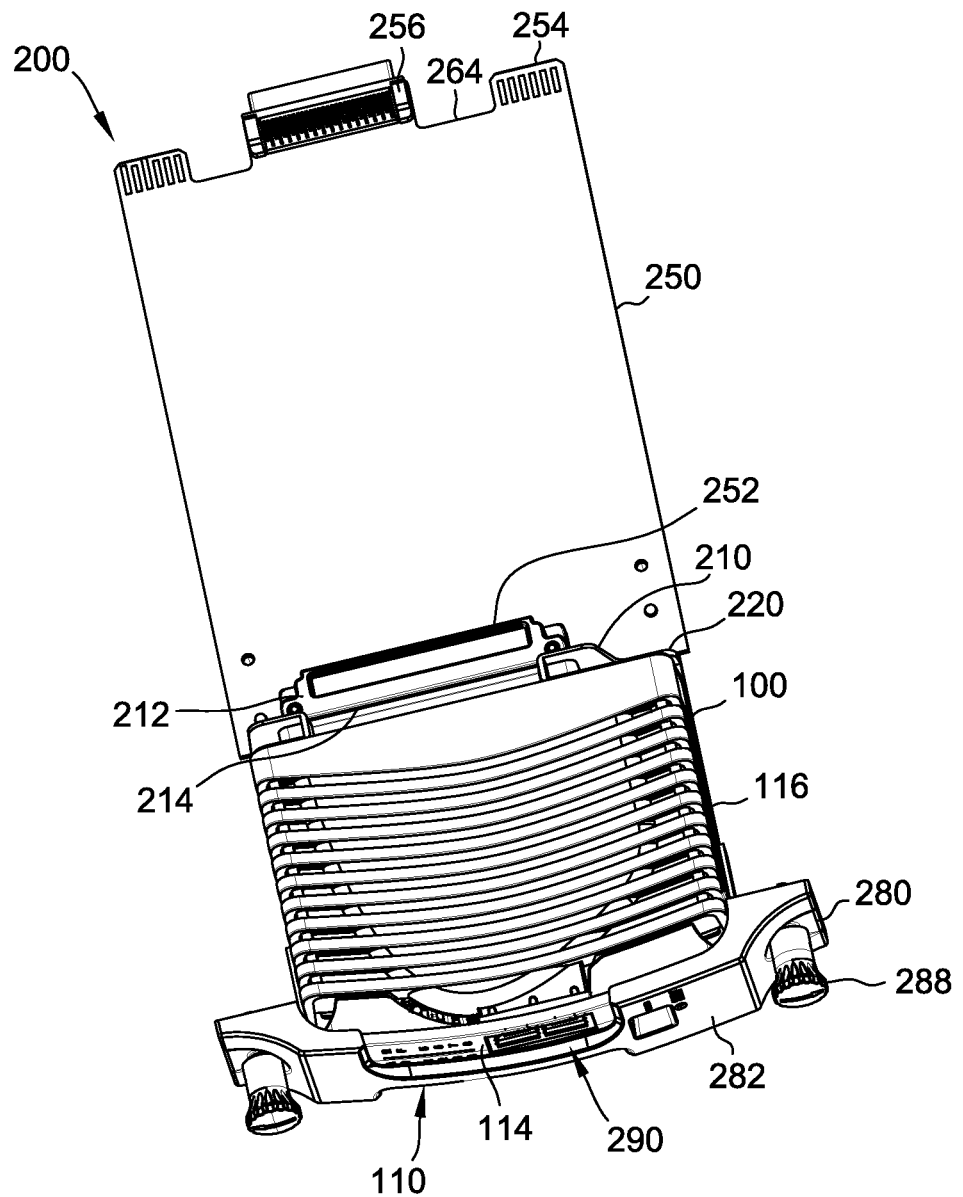
FIG. 6 illustrates a perspective view of a carrier module assembly in accordance with one or more embodiments of the present disclosure.

A generally cylindrical mount 106 extends from a side wall 104 of the housing 102. As best shown in FIGS. 2 and 3, the cylindrical mount 106 includes a bore 107 extending axially through the mount 106. In some embodiments, the mount 106 is on an opposite side wall from the cooling element 116. As explained in further detail below, a fastener can be inserted into the bore of the mount 106 for connecting the module 100 to other components of the present disclosure.

As best shown in FIG. 1, the housing 102 includes an interface 110 along the front of the housing. In some embodiments, the interface 110 includes one or more of a connection port 112 and status indicators 114. In some embodiments, the connection port 112 is a serial connection port, an ETHERNET connection port, a USB port, or a fiber optic connection port. In some embodiments, the status indicators 114 are correspond to one or more channels, connections or processes executed by the module 100.

As shown in FIG. 2, the housing 102 defines a rear connector 108 within which is disposed along the PCB enclosed by the housing 102. The rear connector 108 is adapted to receive a mating connection member which may be included along a mating PCB (not shown). The rear connector 108 is configured as a MOBUS connector or more generally a data communications protocol for use with programmable logic controllers. The rear connector 108 and mating PCB connection are joined in a conventional manner.

When the module is installed for use, circuitry on the PCB processes field inputs received from sensors in the field or control outputs received from one or more I/O or controller devices, depending on whether the module 100 is programmed for use to monitor and process inputs or outputs, or whether the module 100 is an I/O module or a controller device. More specifically, the circuitry converts analog signals received from devices installed in a location/field of interest (e.g., analog 4-20 mA, digital 24 VDC etc.) and converts the analog signals to digital controller signals, and also converts digital signals to analog signals, by using conventional analog-to-digital and/or digital-to-analog converters. The circuitry also conditions the signals received from, or transmitted to the field, by effectively using switches, filters and multiplexers. As a result, the required signal is isolated from the plurality of field signals received and transmitted by the one or more I/O or controller devices.

As shown in FIGS. 6 through 9, a carrier module assembly 200 comprises a carrier frame 210, a carrier riser 250 and module 100 attached to the carrier frame. The carrier frame 210 and the carrier riser 250 define a carrier subassembly 202.

Figure 11:
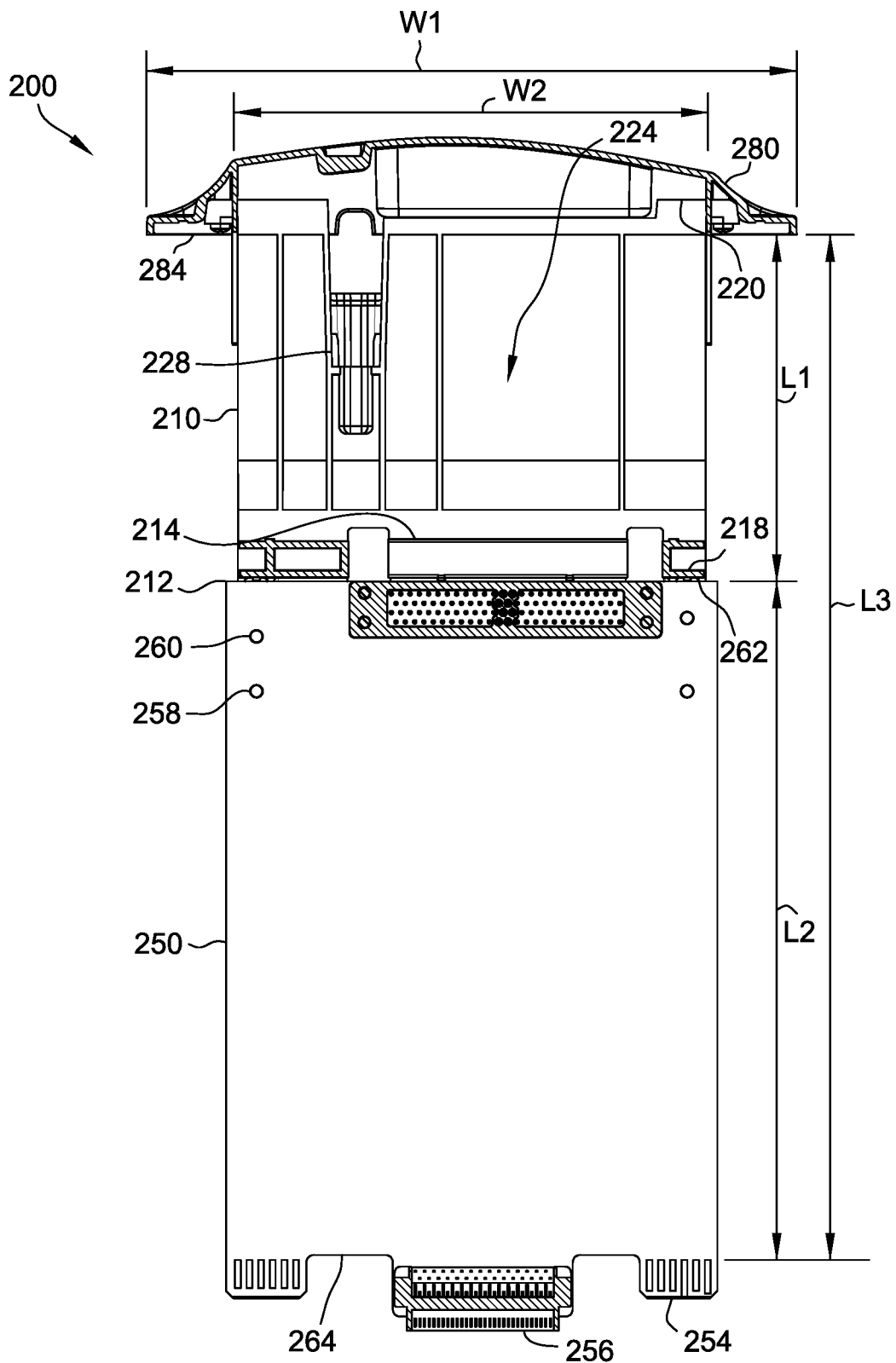
FIG. 11 illustrates a side view of the carrier module assembly of FIG. 6.

The carrier frame 210 includes an elongated body having a first end 218 and a second end 220 defining a length L1 (as shown in FIG. 11). The first end 218 includes at least one bore 222 configured to receive a fastener for securing a front plate 280 to the carrier frame 110 as explained in further detail below. In some embodiments, the second end 220 includes a protrusion 226 extending from a surface 224 of the elongated body. In some embodiments, the protrusion 226 is located a distance from the second end 220 of the carrier frame. A socket adapter 212 is disposed on the protrusion 226 to connect the rear connector 108 to a first bus connector 252 of the carrier riser 250. In some embodiments, a set of pins 230 protrude from the surface 224. The socket adapter 212 and of the carrier frame 210 and the first bus connector 252 of the carrier riser 250 are configured as MOBUS connectors or more generally a data communications protocol for use with programmable logic controllers.

Figure 8:
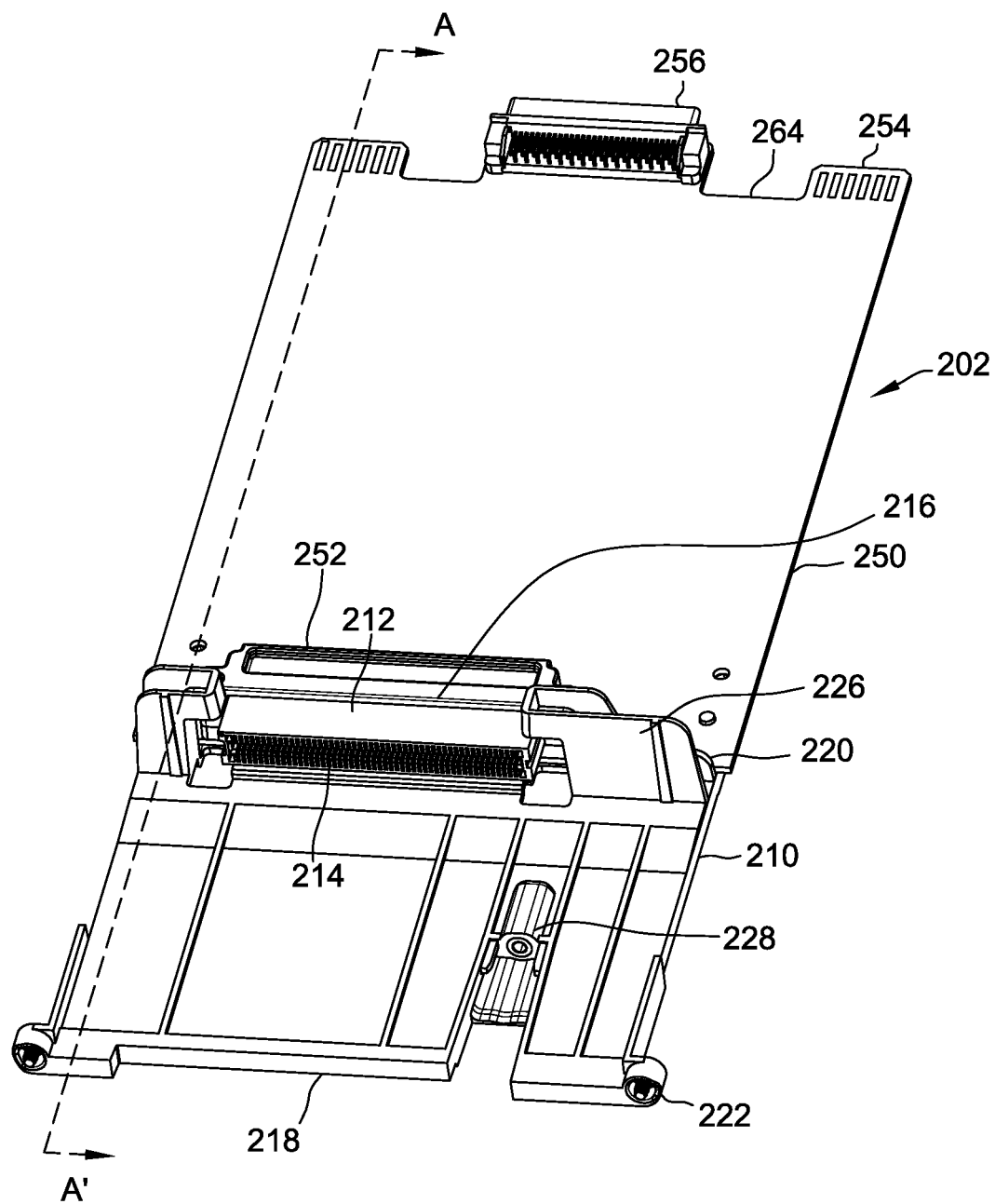
FIG. 8 illustrates a perspective view of the carrier module assembly of FIG. 6.
Figure 9:
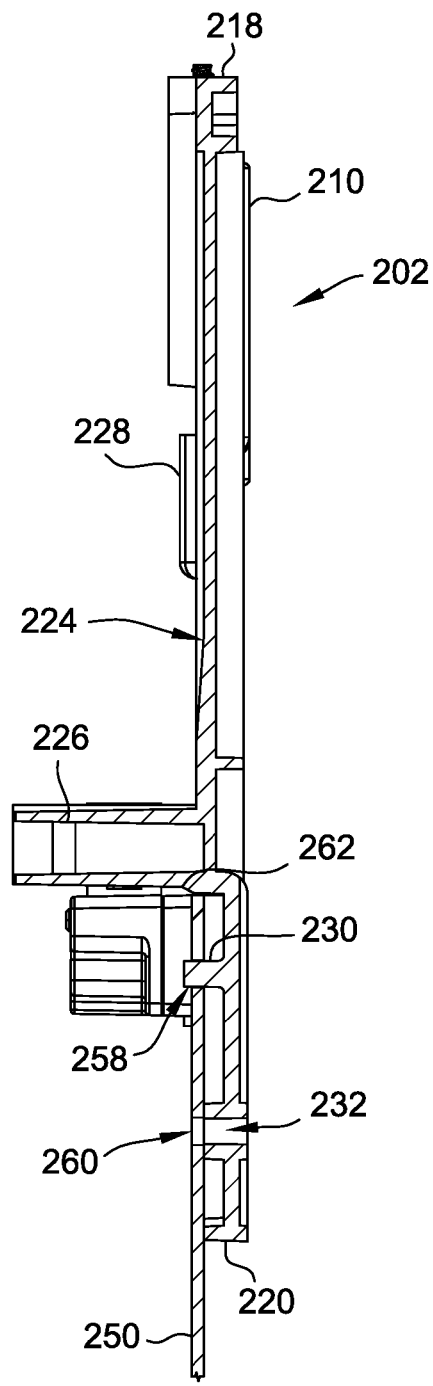
FIG. 9 illustrates a cross-sectional view of the carrier module assembly of FIG. 6 taken along line A-A' of FIG. 6.

As best shown in FIGS. 8 and 9, in some embodiments, a set of apertures 232 are provided along the surface 224 of the carrier frame 210. The set of pins 230 of the carrier frame 210 are configured to interdigitate with a first corresponding apertures 258 of the carrier riser 250 when the carrier frame 10 is placed over the carrier riser 250. In some embodiments, the set of apertures 232 of the carrier frame 210 are configured to receive pins (not shown) of the carrier frame 210, forming a snap-fit connection. In some embodiments, the set of apertures 232 are aligned with a second corresponding set of apertures 260 such that fasteners can be inserted through the carrier frame 210 and carrier riser 250, reversibly connecting the carrier frame 210 and carrier riser 250.

As best shown in FIG. 8, in some embodiments, the surface 224 includes a cylindrical mount 228 for mechanically securing the module 100 and the carrier frame 210. When securing the module to the carrier frame, the side wall 104 of the module 100 is positioned adjacent the surface 224 of the carrier frame 210 such that the cylindrical mount 106 of the module 100 and the cylindrical mount 228 of the carrier frame are aligned to enable a fastener to be inserted through the bore 107. A fastener is threaded through the cylindrical mount 106 of the module 100 and the cylindrical mount 228 of the carrier frame 210 to removably secure the module 100 to the carrier frame 210. In some embodiments, the module 100 is secured to the carrier frame 210 through other fastening means, such as a snap-fit or with the use of adhesive between the module 100 and the carrier frame 210.

Figure 16:
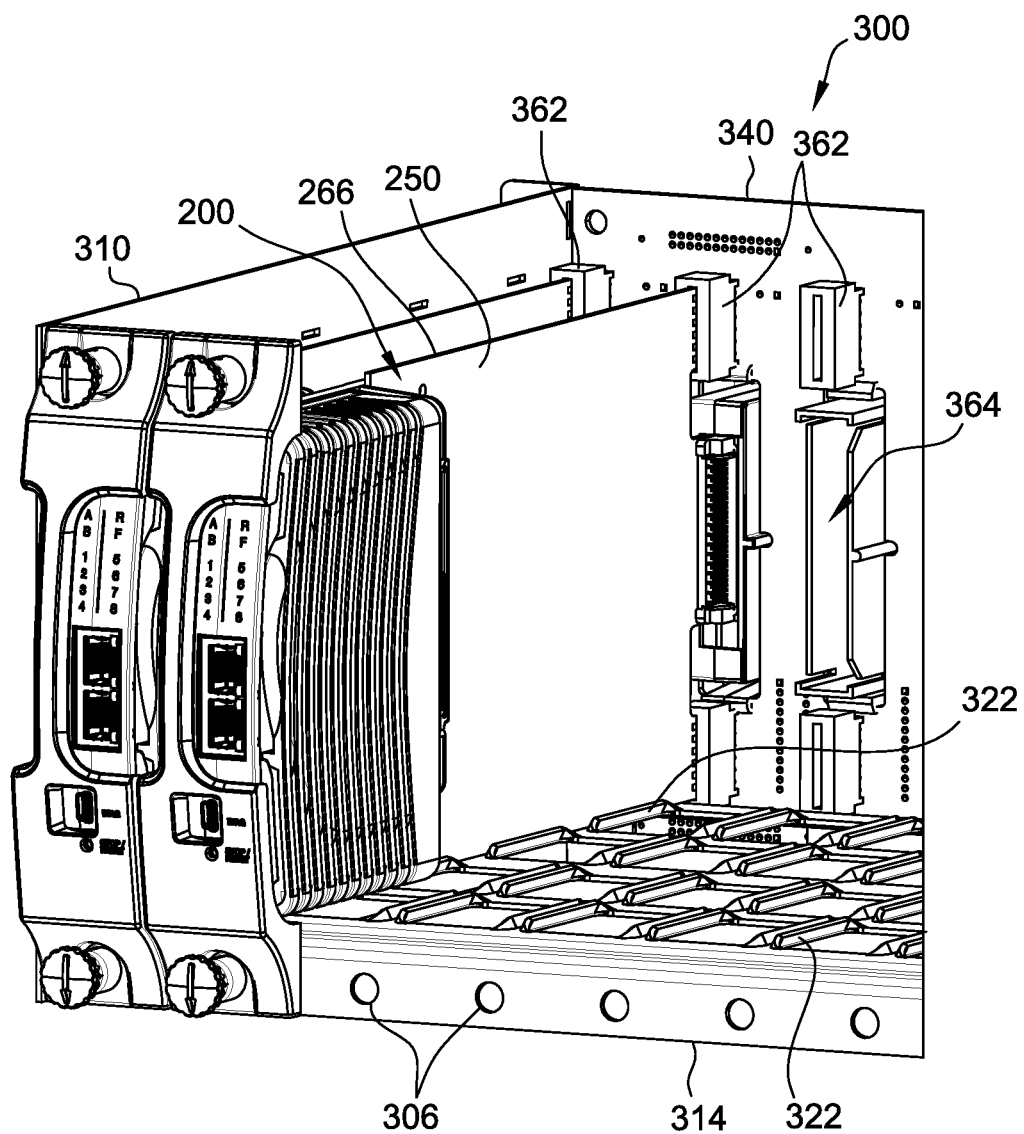
FIG. 16 illustrates a perspective view of the control cabinet of FIG. 15 with the legacy devices removed from the control cabinet.

Referring to FIGS. 6 through 9, the carrier riser 250 includes an elongated body having a first end 262 and a second end 264 defining a length L2 (as shown in FIG. 11). The carrier riser 250 includes a first bus connector 252 configured to interdigitate with the second side portion 216 of the socket adapter 212 of the carrier frame 210. In some embodiments, the carrier riser 250 further includes a bus port 254 extending from the second end 264. In some embodiments, the carrier riser 250 further includes a second bus connector 256 extending from the second end 264. In some embodiments, the bus port 254 is configured to supply power or an electrical current to the module 100. As explained in further detail below, the bus port 254 of the carrier riser 250 is configured to interdigitate with a bus port 362 of a backplate 340 of the control cabinet 300 as shown in FIG. 16. In some embodiments, the carrier riser 250 is a PCB configured to transfer electrical and data signals from the first bus connector 252 to the second bus connector 256 and the bus port 254. In some embodiments, the carrier riser 250 includes a body having electrical traces or pathways configured to transfer electrical and data signals from the first bus connector 252 to the second bus connector 256 and the bus port 254.

Figure 7:
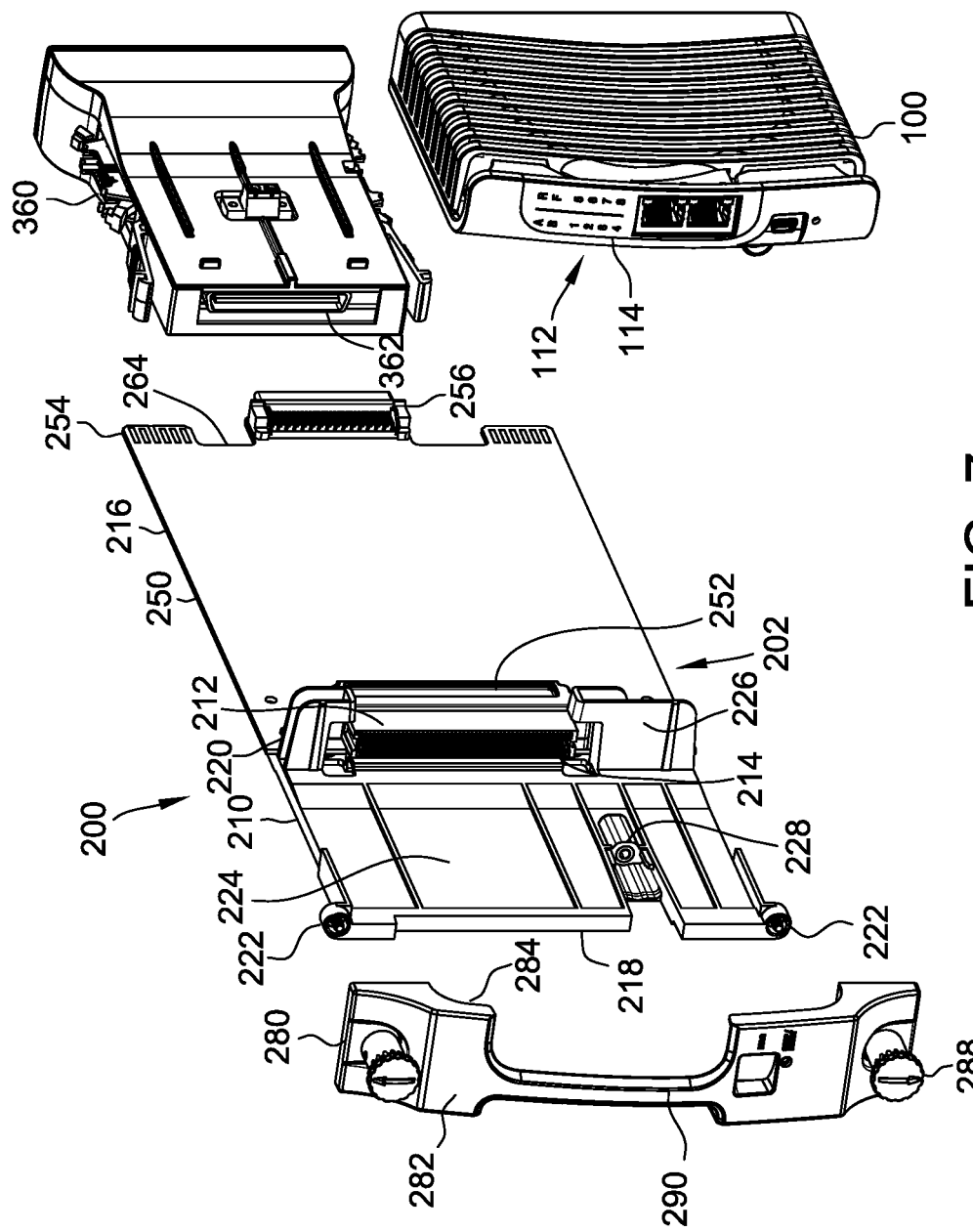
FIG. 7 illustrates an exploded view of the carrier module assembly of FIG. 6.
Figure 14:
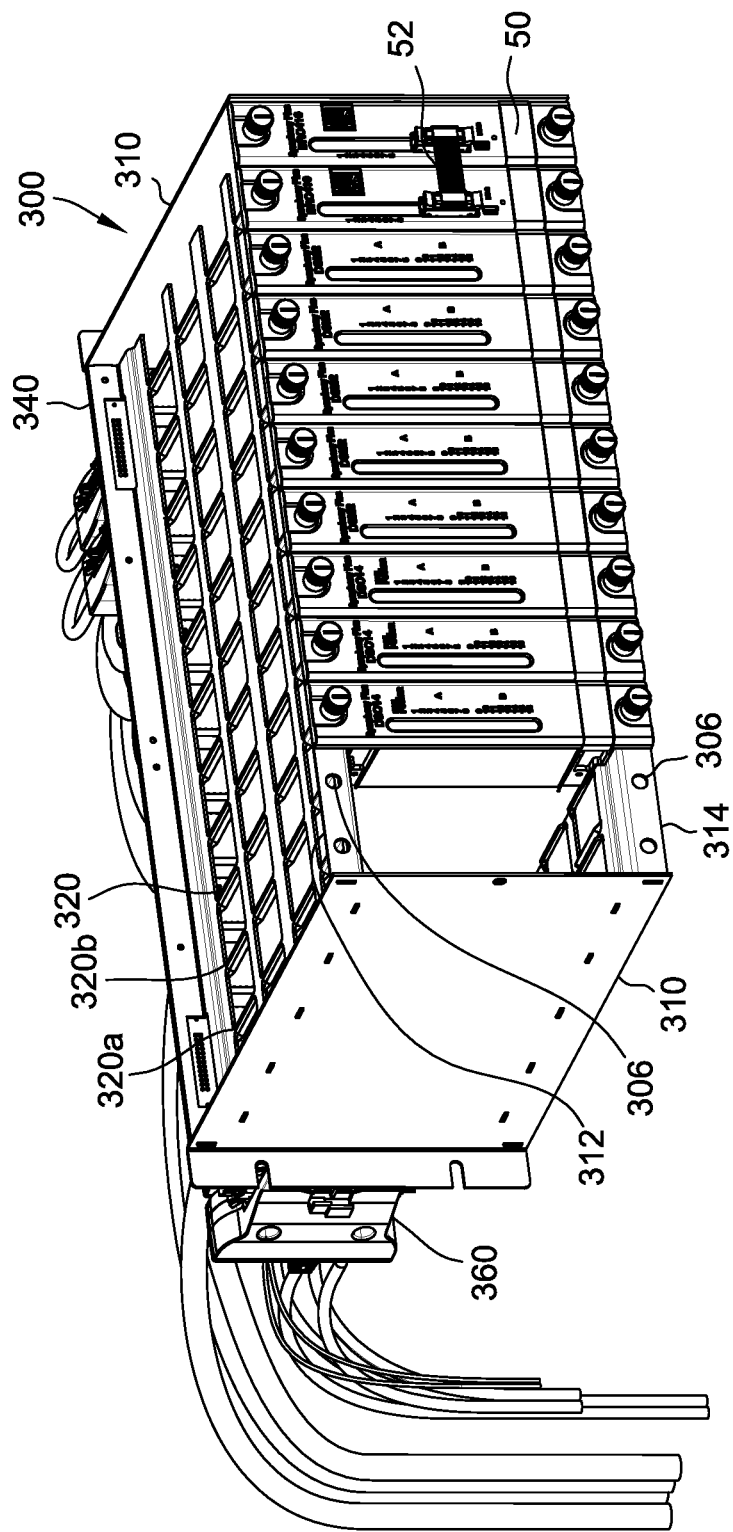
FIG. 14 illustrates a perspective view of the control cabinet of FIG. 13 having two slots unoccupied by legacy devices.
Figure 17:
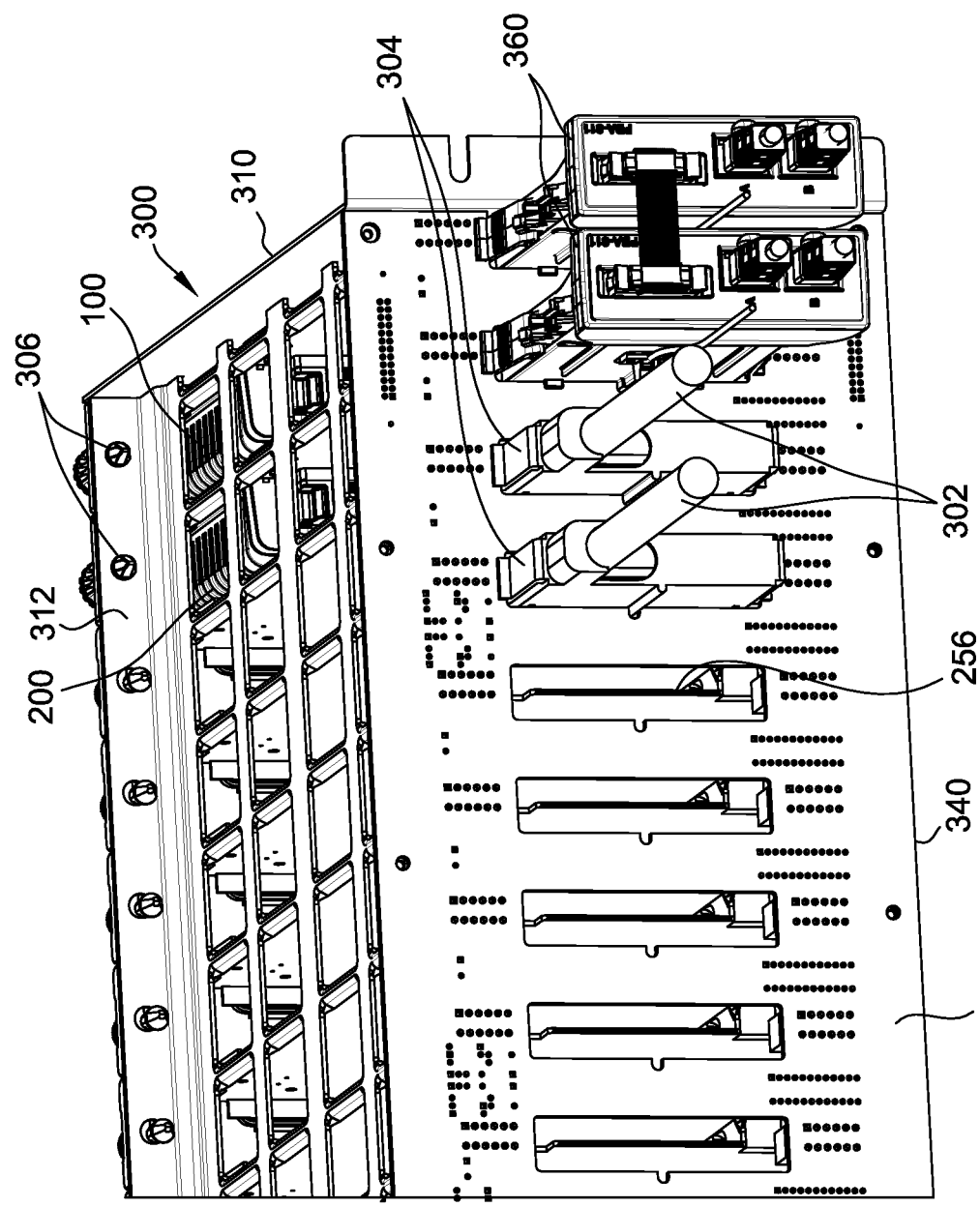
FIG. 17 illustrates a rear perspective view of the control cabinet of FIG. 18 illustrates a top view of the control cabinet of FIG. 16.

In some embodiments, the second bus connector 256 is a MOBUS connector or more generally a data communications protocol for use with programmable logic controllers. The second bus connector 256 is configured to connect to connect to either a process socket adapter 360 or a pin connector 304 of a cable 302 (as shown in FIGS. 7, 14 and 17). As shown in FIGS. 7 and 17, the process socket adapter 360 includes a first end having the bus connector 362 and a second end having PLC connectors or system connectors such as MOBUS, ETHERNET, digital, analogue connectors.

Figure 10:
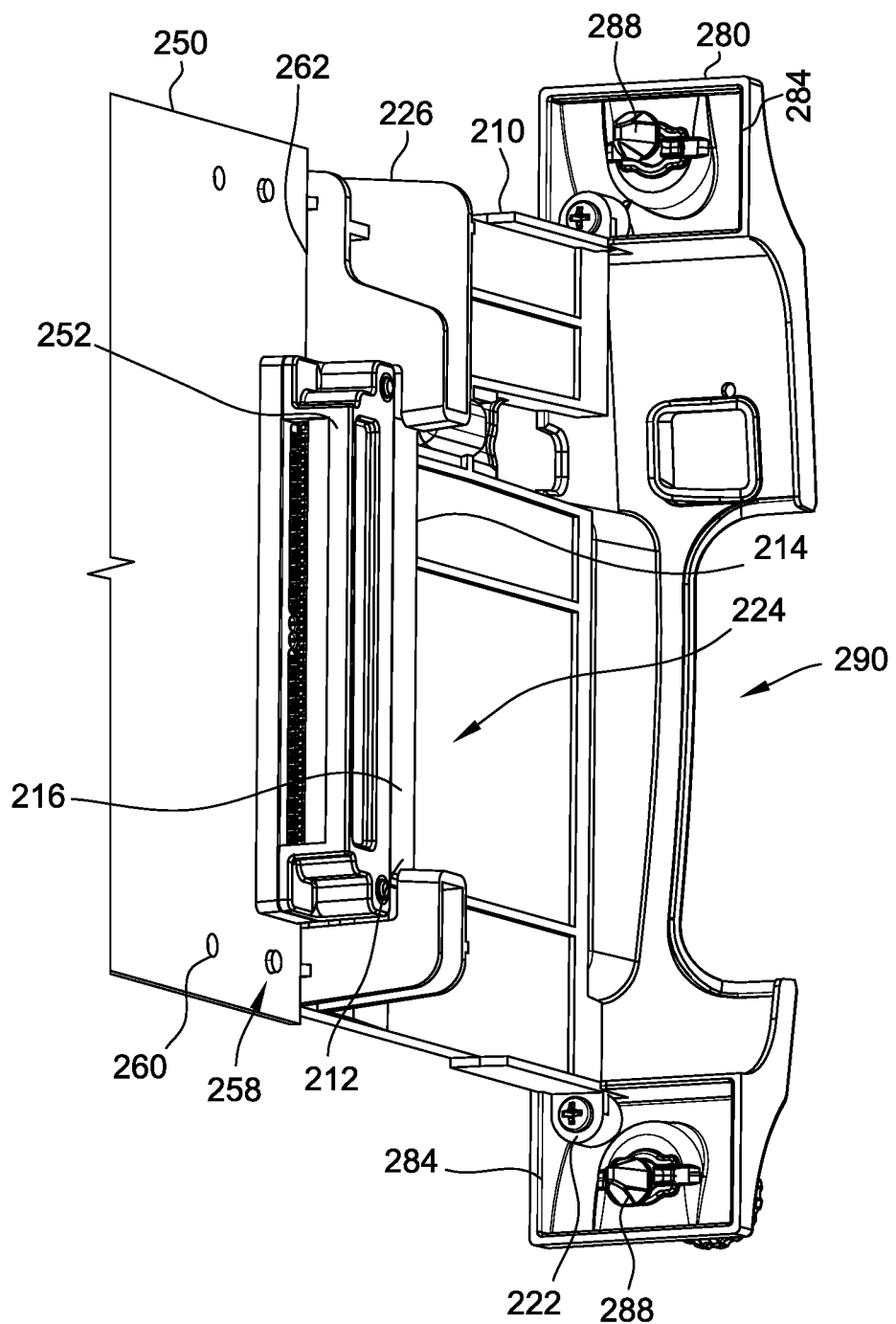
FIG. 10 illustrates a perspective view of the carrier module assembly of FIG. 6.

Referring to FIGS. 7, 10 and 11, a front plate 280 is removably connected to the carrier frame 210. The front plate 280 includes body having a first end 282 and a second end 284. The front plate 280 has a width W1 that is greater than a width W2 of the carrier frame 210 such that the front plate 280 protrudes beyond either side of the carrier frame 210. The front plate 280 further includes a first set of threaded apertures (not shown) extending partially into the second end 284 where the front plate 280 protrudes beyond the carrier frame 210. Each of the first set of threaded apertures are configured to align with the at least one bore 222 of the carrier frame 210 such that the front plate 280 can be removably attached to the carrier frame 210.

The module 100, carrier frame 210 and carrier riser 250 are removably connected to one another forming the carrier module assembly 200. The module 100 can be separated from a carrier subassembly 202 defined by the carrier frame 210 and carrier riser 250. The carrier module assembly 200 is sized to fit into a slot 320 of the control cabinet 300. The ability to suitably size the carrier module assembly to fit into exiting control cabinet configurations enable the efficient and effective replacement of legacy I/O devices and controller devices. As shown in FIG. 11, the carrier module assembly 200 has a total length L3 defined by the length L1 of the carrier frame 210 and the length L2 of the carrier riser 250. For the module 100 of the present disclosure, the length L1 of the carrier frame 210 is substantially equal to the length of the module 100.

Carrier risers of different lengths L2 can replace the carrier riser 250 in order to retrofit the carrier module assembly 200 in control cabinets of different lengths. By way of example, while most control cabinets have a standard slot length of approximately 12 inches, (30.48 cm) control cabinets can have lengths in the range of 10 to 18 inches. Thus, carrier risers 250 of any suitable length can be mated with carrier frame 210 such that the carrier module assembly 200 can be fit, installed or retrofitted into cabinets having slot lengths of 10 to 18 inches (25.4 cm to 45.72 cm). Stated differently, the carrier module assembly 200 can have a total length LT of 10 to 18 inches, and for the module 100 of the present disclosure, a shorter or longer carrier riser 250 can be used to install the module 100 into the legacy control cabinet. As explained in further detail below, the module 100 can be removed from the carrier module assembly 200 and installed into other cabinets or racks.

Figure 12:
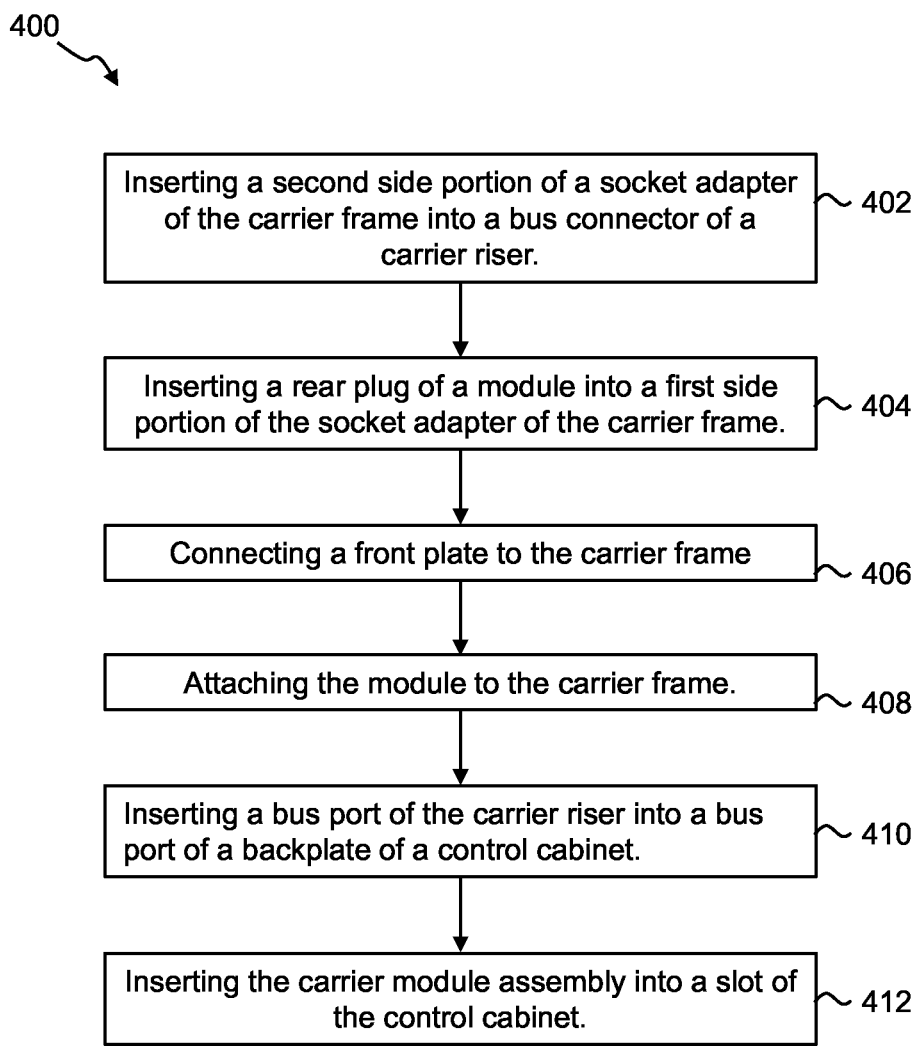
FIG. 12 illustrates a flow chart of a method of assembling the carrier module assembly of FIG. 6.

As shown in FIG. 12 a method 400 of assembling the carrier module assembly 200 comprises inserting 402 the second side portion 216 of the socket adapter 212 of the carrier frame 210 into the first bus connector 252 of a carrier riser 250; inserting 404 the rear connector 108 of a module into the first side portion 214 of the socket adapter 212 of the carrier frame 210; and, connecting 406 the front plate 280 to the carrier frame 210. In some embodiments, the method further comprises attaching 408 the module 100 to the carrier frame 210. In some embodiments, the method further comprises inserting 410 the bus port 254 of the carrier riser 250 into the port 356 of the backplate 340 of the control cabinet 300. In some embodiments, the method further comprises inserting 412 the carrier module assembly 200 into a slot 320 of the control cabinet 300.

Figure 13:
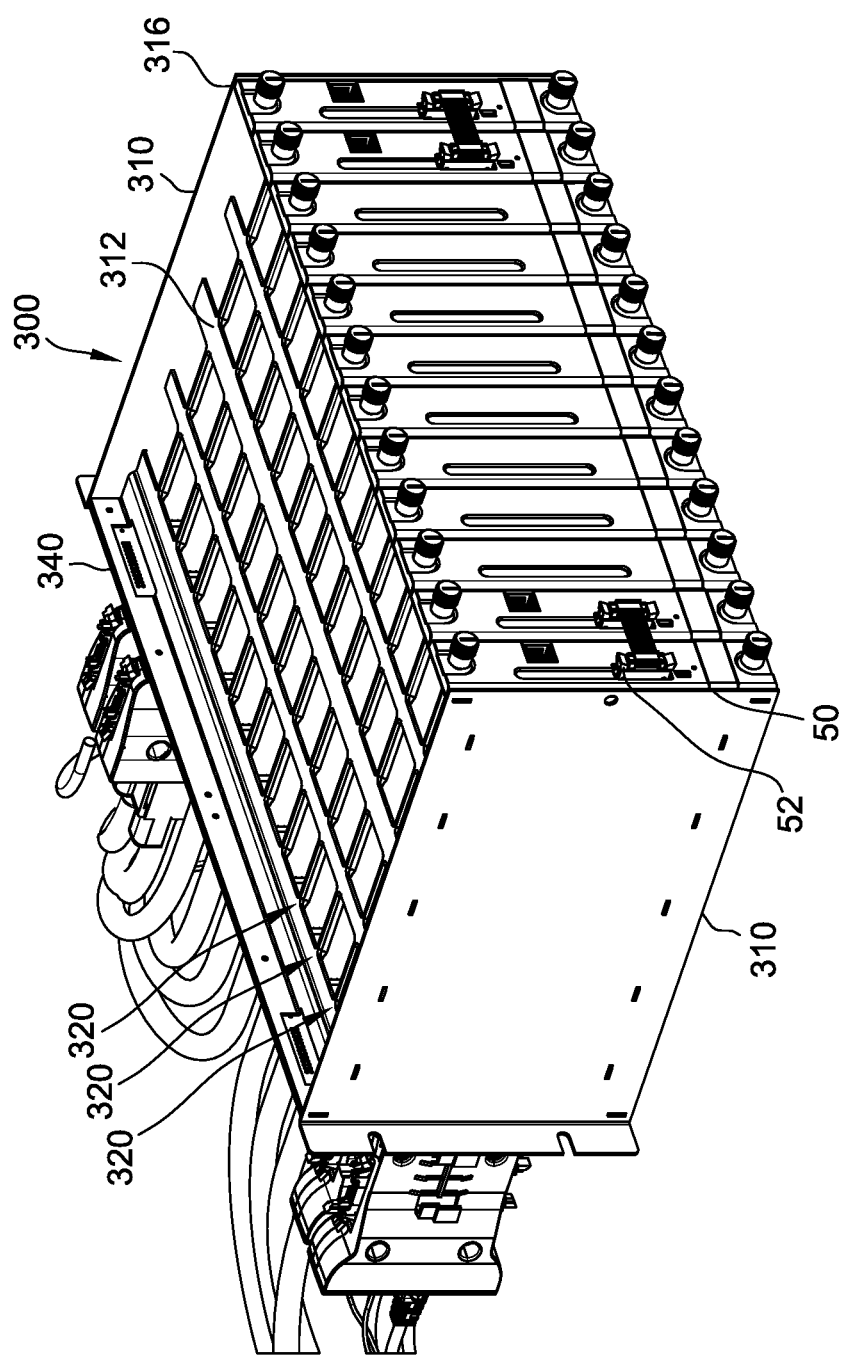
FIG. 13 illustrates a perspective view of a control cabinet having legacy devices disposed within slots of the control cabinet in accordance with one or more embodiments of the present disclosure.

FIG. 13 illustrates the control cabinet 300 with a row of legacy/existing devices 50 disposed side-by-side in a plurality of associated slots 320. A number of similar exemplary slots are identified as 320a, 320b, and 320c in FIG. 13. FIG. 14 illustrates the control cabinet 300 having two empty slots 320a and 320b of the plurality of slots 320. FIGS. 15 through 18 illustrate carrier module assemblies 200 of the present disclosure installed or retrofitted into the two empty slots 320a and 320b of FIG. 14 control cabinet 300. The extended field use of legacy devices 50 causes the operation of the legacy devices to degrade over time. The functional degradation of existing control cabinets 300 requires their frequent repair or replacement. The module 100 as disclosed herein can be used to replace/repair known legacy devices 50 however the module 100 cannot be installed in an existing control cabinet 300 without significant re-wiring, modification or replacement of the entire control cabinet 300 because the module 100 is smaller than the legacy device 50. The carrier module assembly 200 of the present disclosure enables module 100 to be located in an existing cabinet without the need to re-wire or modify the control cabinet 300.

As previously described, the carrier module assembly 200 has a total length L3 defined by the length L1 of the carrier frame 210 and the length L2 of the carrier riser 250. The length of the module 100 is substantially the same of carrier frame 210. The total length L3 is suitable to enable the carrier module assembly to be located in a control cabinet without rewiring or other typical modifications. The total length of the carrier assembly L3 is substantially the same as the length of the cabinet L4, described in detail below, and enables the assembly to be received in the cabinet slot. Depending on the size of the control cabinet 300, as the cabinet length L4 varies, a carrier riser 250 having a suitable length L2 can be provided so that the length L3 aligns with the control cabinet length L4.

Figure 18:
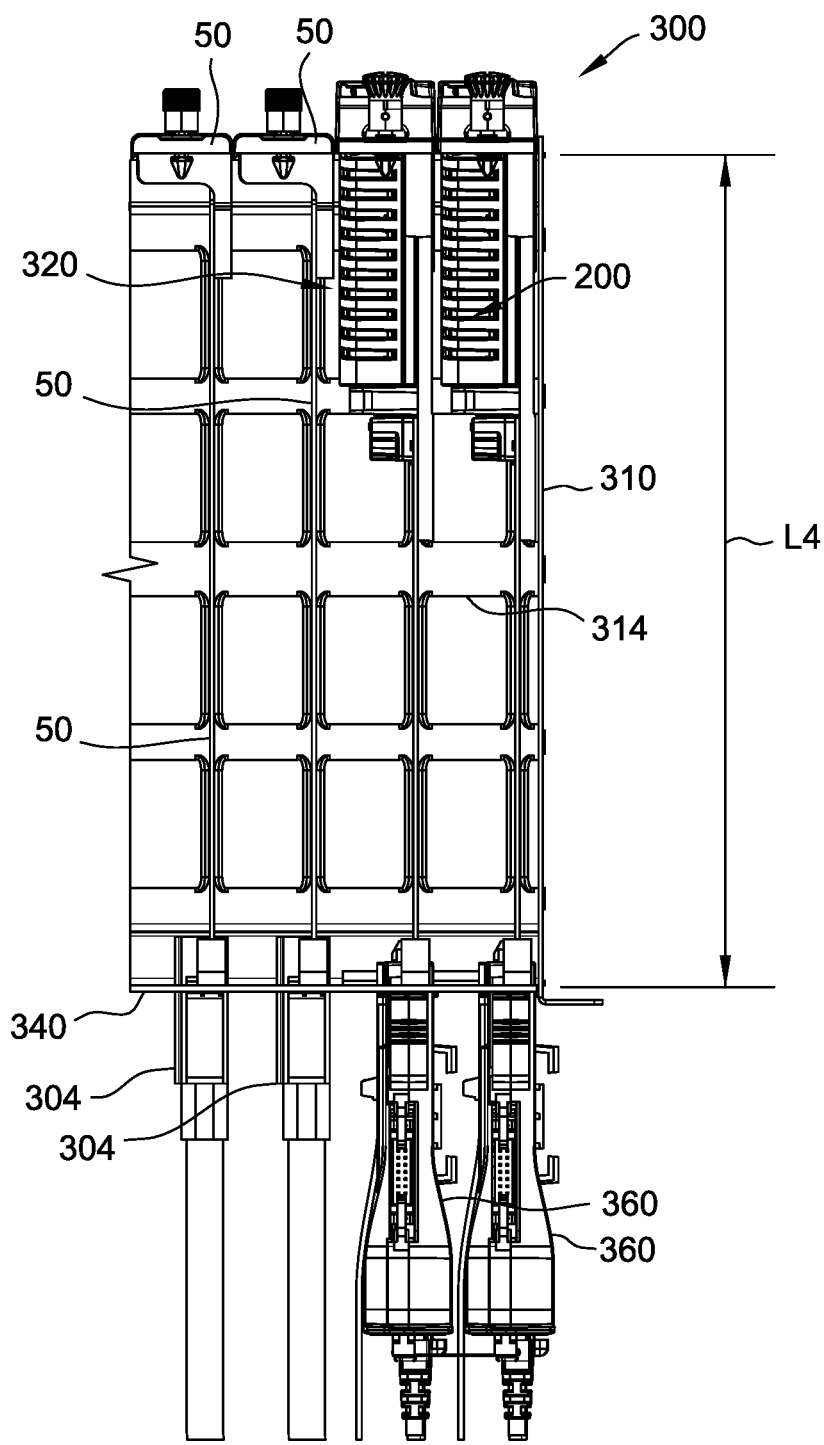

As shown in FIG. 13, FIG. 14, and FIGS. 17 through 18, a control cabinet 300 in the field supports a plurality of installed legacy devices 50. The control cabinet 300 has an enclosure defined by the backplate 340, side plates 310, a top plate 312 and a bottom plate 314. The ends of the backplate 340, top plate 312 and bottom plate 314 are supported at the plate ends by the side plates 310 in a conventional manner. Each of the top plate 312 and bottom plate 314 includes a plurality of frontwardly-directed bores 306a, and 306b respectively. The bores 306 extend along the top and bottom plates between the side plates 310. As shown in FIG. 14, pairs of horizontally aligned top and bottom bores 306a and 306b are located above and below the access opening for the respective slot 320. The slot 320 extends from a front end 316 to the backplate 340 and has a length L4 which also defines the length of the cabinet. Adjacent legacy devices 50 can be connected in series by a bridge 52 to increase commutative power. As shown in FIGS. 17 and 18, the legacy devices 50 are connected to either a pin connector 304 or a process socket adapter 360. The legacy devices 50 are secured by fastening the legacy devices to an aligned pair of bores 306a, 306b. Likewise, the front plate 280 further includes a second set of apertures (not shown) extending through the first end 282 and the second end 284. The second set of apertures are configured to align with bores 306 of the control cabinet 300. The second set of apertures can be threaded or otherwise secured to the cabinet 300 by fasteners 288. The first set of apertures and the second set of apertures are disposed on protruding portions of the front plate 280. The front plate 280 further includes an opening 290 extending through the body such that the opening provides access the interface 110 of the module 100 when the module 100 is attached to the carrier frame 210. In some embodiments, the front plate 280 abuts the interface 110 of the module 100.

Figure 15:
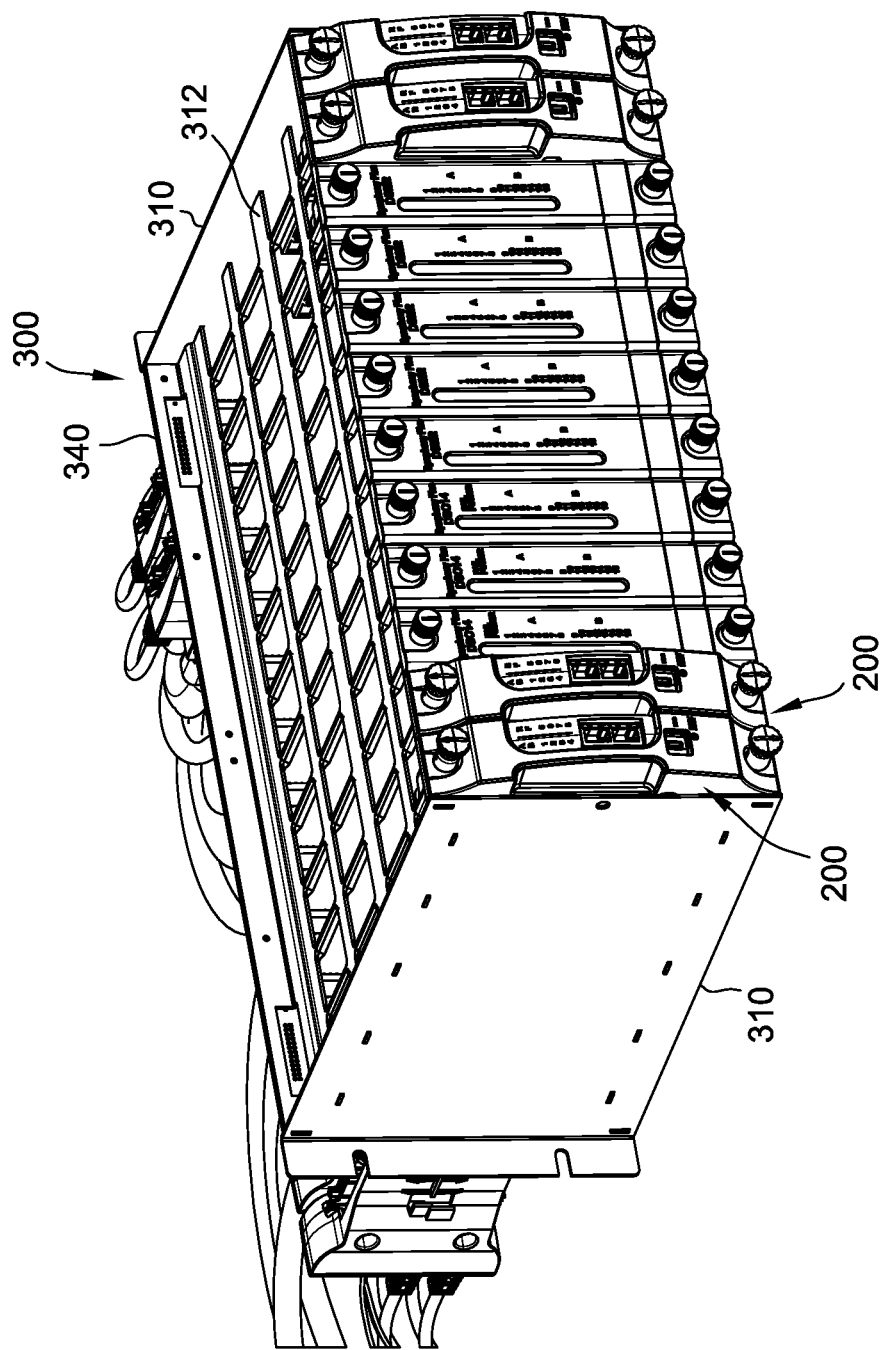
FIG. 15 illustrates a perspective view of the control cabinet of FIG. 14 where the carrier module assembly of FIG. 6 is installed into the two unoccupied slots of FIG. 14.

As shown in FIG. 14, one or more legacy devices 50 can be removed and replaced from the slots 320 of the control cabinet 300. The legacy devices 50 are removed without the need to remove or re-wire the pin connector 304 or the process socket adapter 360. As shown in FIG. 15, carrier module assemblies 200 can be installed to generally replace legacy controllers, and specifically, for illustrative purposes into the empty slots 320a and 320b of the plurality of slots 320. As shown in FIG. 15, FIG. 17, and FIG. 18, the carrier module assembly 200 is installed without having to remove or re-wire the pin connector 304 or the process socket adapter 360 due to the total length L3 of the carrier module assemblies 200 being equal to the length L4 of the slots 320.

As shown in FIG. 16 and FIG. 17, each slot 320 includes a rail 322 disposed on the top plate 312 (not shown) and the bottom plate 314. The rail 322 extends at least partially the length L4 of the slot 320 and is configured to interdigitate with a side edge 266 of the carrier riser 250. The rail 322 ensures that the carrier module assembly 200 is properly positioned in the slot 320 by orienting the carrier module assembly 200 as the assembly 200 is inserted into the slot 320, until the assembly end 264 is located adjacent the backplate 340. The backplate 340 in some embodiments is a PCB. The backplate 340 in some embodiments is a PCB with a metal backplate for rigidity and support. The backplate 340 includes a bus port 362 for each slot 320, and the bus port 362 is configured to interdigitate with the bus port 254 of the carrier riser 250 to provide power to the module 100. The backplate 340 further includes an opening 364 for the second bus connector 256 of the carrier riser to at least partially pass through such that the second bus connector 256 can be connected to one of the process socket adapter 360 or the pin connector 304 of the cable 302, as shown in FIG. 17. As shown in FIG. 16, the carrier module assembly 200 can be removably secured to the control cabinet 300 by fasteners 288 that are received by the bores 306 and tightened to the front plate against the to the top and bottom plates.

Thus, the legacy device 50, which can be an I/O device or a controller device, can be withdrawn from the control cabinet 300 and the carrier module assembly 200 can be inserted into the empty slot 320. Newly installed carrier module assembly 200 can communicate and operate with existing legacy devices 50 installed and operating with the control cabinet 300. Thus, replacement of the entire control cabinet 300 is not necessary, as only individual legacy devices 50 need to be replaced by carrier module assemblies 200 as needed. The carrier module assemblies 200 can be installed to replace a defective legacy device 50 or to upgrade the control cabinet 300 with additional features of the module 100. Because the carrier riser 250 can be of any length L2, the carrier module assembly 200 can be installed into a standard control cabinet 300 having a slot 320 length L4 of 12 inches, (30.48 cm) or into non-standard control cabinets having slot lengths L4 of 10 inches to 18 inches. (25.4 cm to 45.72 cm)

Figure 19:
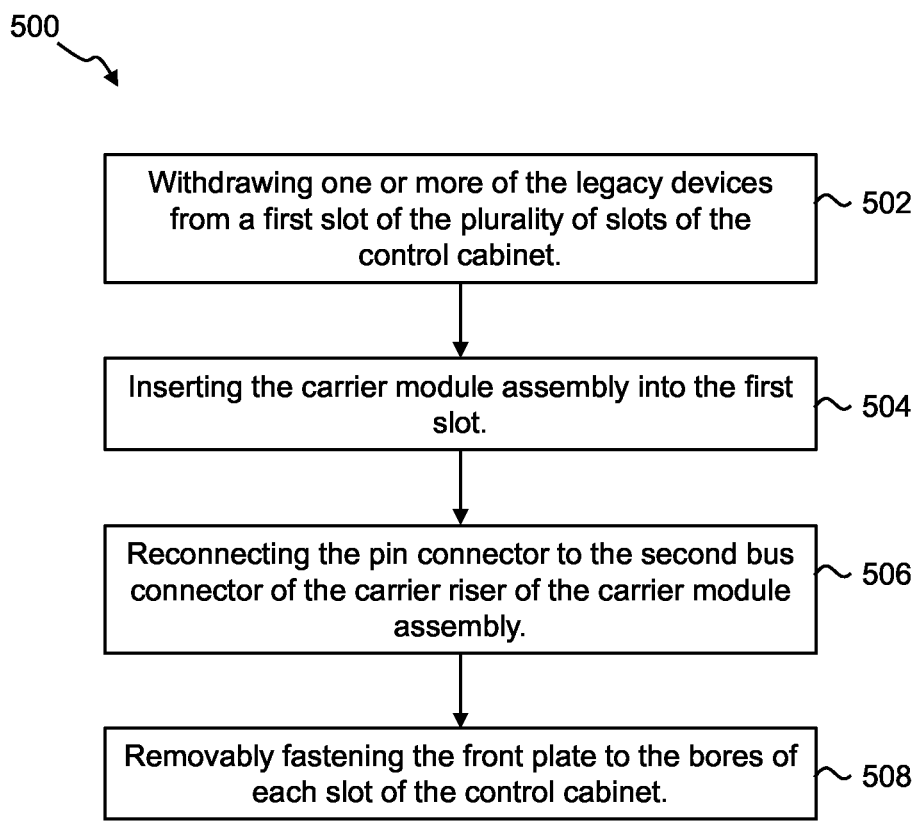
FIG. 19 illustrates a flow chart of a method of retrofitting the control cabinet of FIG. 16 with the carrier module assembly of the present disclosure.
Figure 20:
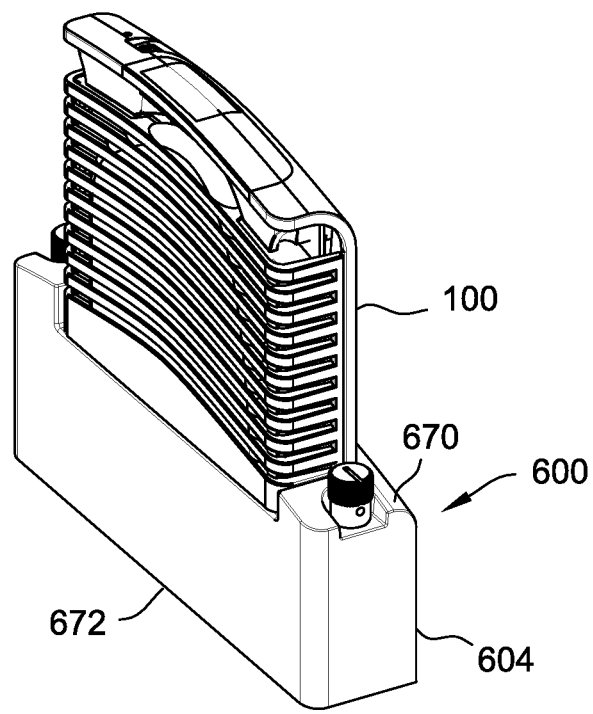
FIG. 20 illustrates a perspective view of a carrier module assembly in accordance with one or more embodiments of the present disclosure.

As shown in FIG. 19 a method 500 of retrofitting the carrier module assembly 200 to the control cabinet 300 comprises withdrawing 502 one or more of the legacy devices 50 from a first slot 320 of the plurality of slots 320 of the control cabinet 300, the one or more of the legacy devices 50 connected to the backplate 340 of the control cabinet 300; inserting 504 the carrier module assembly 200 into the first slot 320 (one of the two empty slots 320a and 320b of FIG. 16); and reconnecting 506 the pin connector 304 to the second bus connector 256 of the carrier riser 250 of the carrier module assembly 200. In some embodiments, the method 500 further comprises removably fastening 508 the front plate 280 to the bores 306 of each slot 320 of the control cabinet 300.

The carrier module assembly 200 and the module 100 can be installed and retrofitted into control cabinets 300 in the field. The module 100 is able to communicate and integrate with the general controller system. Because the module 100 is removable from the carrier module assembly 200, the module 100 can be removed from the carrier subassembly 202 and the module 100 can be re-used and installed into a controller rack 700 of FIG. 27 and explained in further detail below.

As shown in FIGS. 20 through 27, the module 100 can be removed from the carrier module subassembly 202 and, with the use of a carrier module assembly 600, can be installed into the rack 700. Rack 700 does not include the side plates and associated cabinet length and as a result the carrier module assembly 600 has a length that is less than the length L3 of carrier module assembly 200. More specifically, the carrier module assembly 600 includes the module 100, a carrier frame 610, a carrier riser 650 and a housing 604 surrounding the carrier frame 610 and the carrier riser 650. The carrier frame 610, carrier riser 650 and the housing 604 define a carrier subassembly 602.

Figure 26:
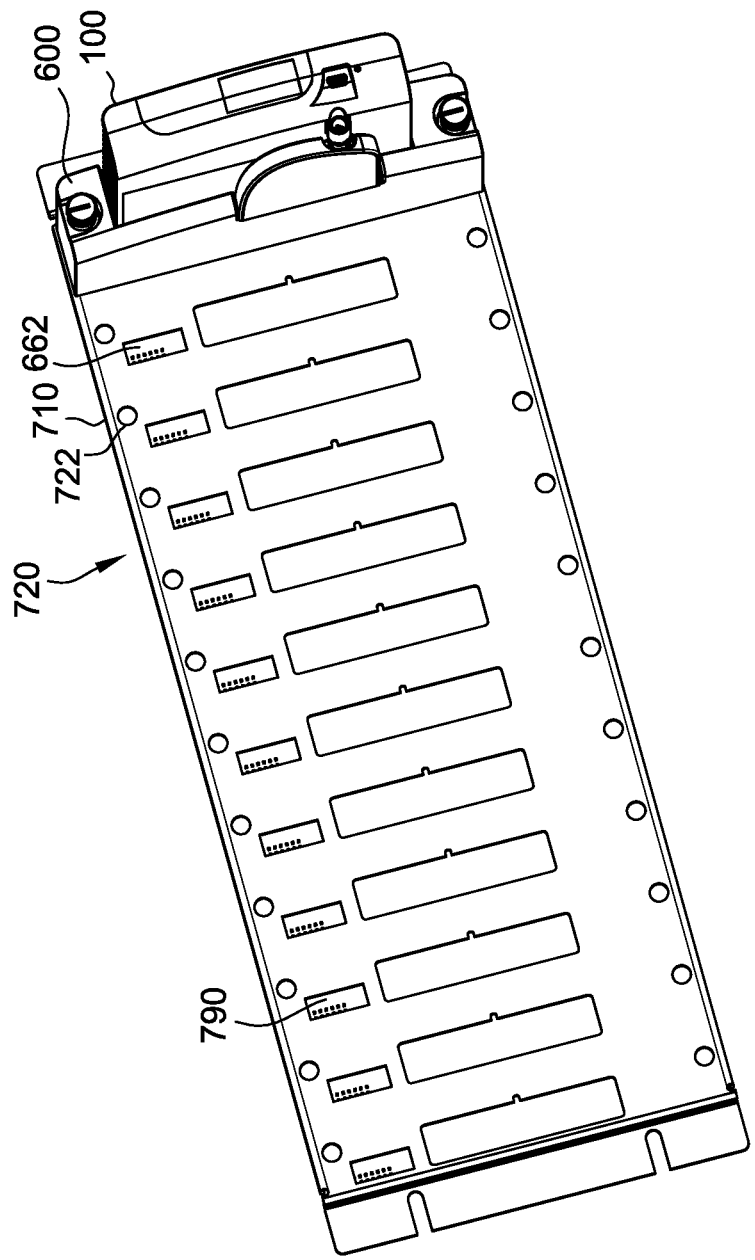
FIG. 26 illustrates a perspective view of a rail in accordance with one or more embodiments of the present disclosure; and, FIG. 27 illustrates a perspective view of carrier modules installed onto the rail of FIG. 26.

Referring to FIGS. 22 through 25, the carrier frame 610 includes a body 611 having a first surface 618 and a second surface 620. A socket adapter 612 is disposed on the body to connect the rear connector 108 to a first bus connector 652 of the carrier riser 250. The socket adapter 612 and of the carrier frame 610 and the first bus connector 652 of the carrier riser 650 are configured as MOBUS connectors or more generally a data communications protocol for use with programmable logic controllers. The carrier riser 650 includes elongated body having a first end 662 and a second end 664. The carrier riser 650 includes a first bus connector 652 configured to interdigitate with a second side portion 616 of the socket adapter 612 of the carrier frame 610. In some embodiments, the carrier riser 250 further includes a bus port 654 extending from the second end 664. In some embodiments, the bus port 654 is configured to supply power or an electrical current to the module 100. The bus port 654 of the carrier riser 650 is configured to interdigitate with a bus port 762 of the backplate 740 of the rack 700 as shown in FIG. 26.

In some embodiments, the second bus connector 656 is a MOBUS connector or more generally a data communications protocol for use with programmable logic controllers. The second bus connector 656 is configured to connect to connect to either a process socket adapter 360 or a pin connector 304 of a cable 302 (as shown in FIGS. 17 and 27).

Figure 21:
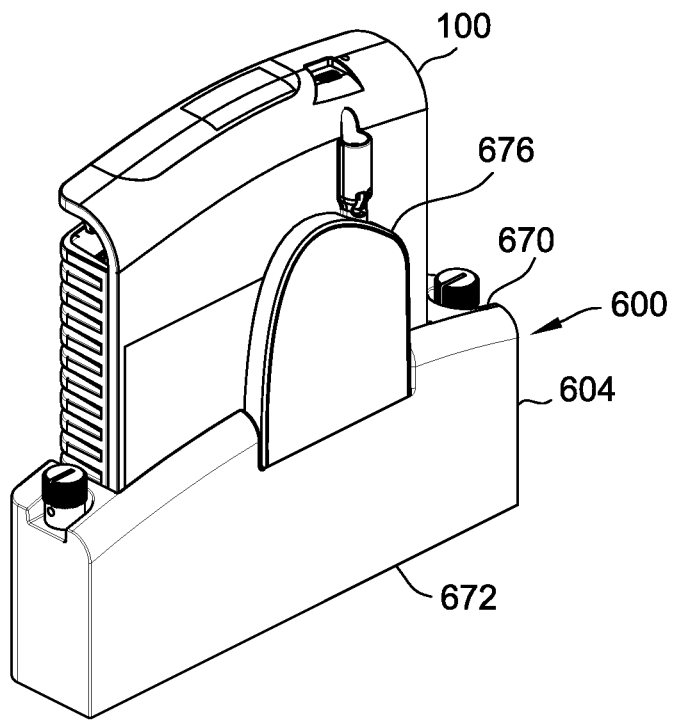
FIG. 21 illustrates a perspective view of the carrier module assembly of FIG. 20.
Figure 22:
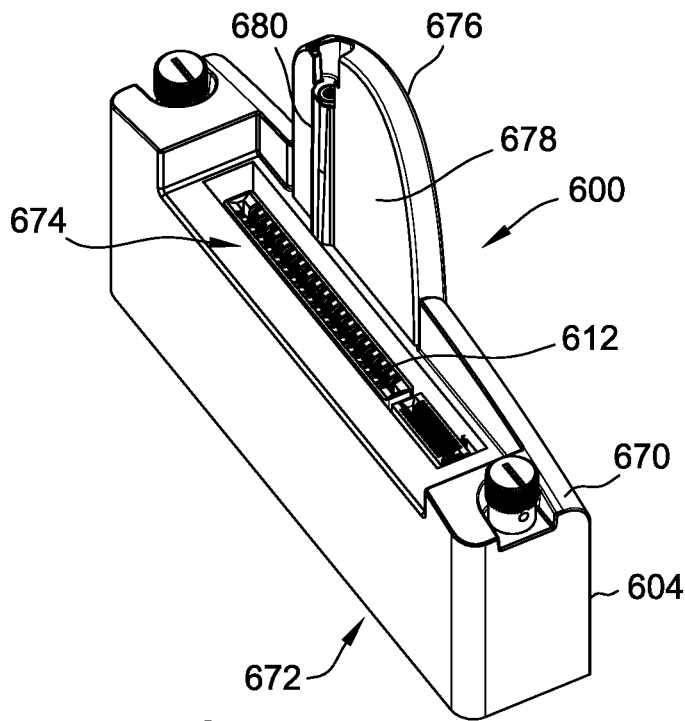
FIG. 22 illustrates a perspective view of the carrier module assembly housing of FIG. 20.
Figure 23:
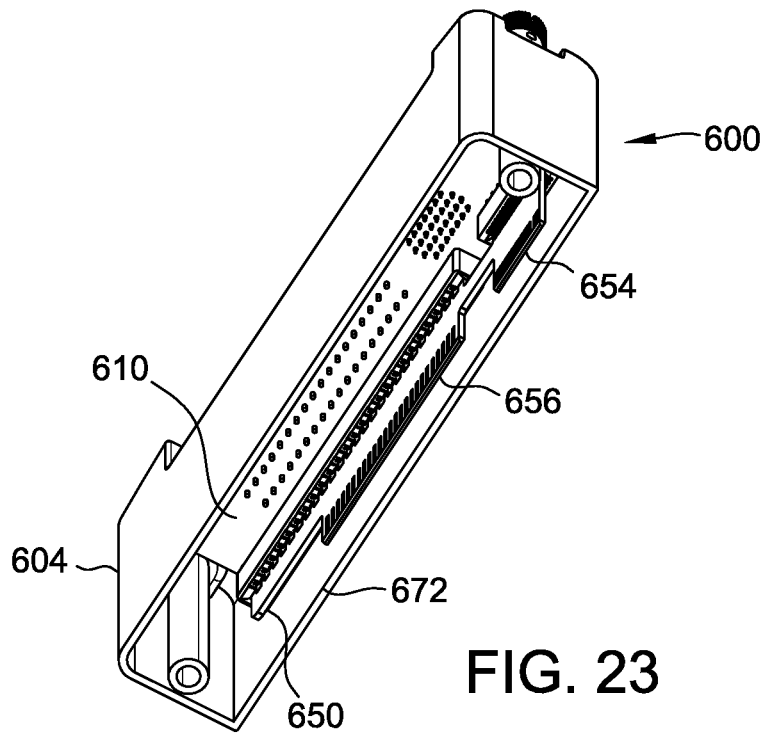
FIG. 23 illustrates a perspective view of the bottom of the carrier module assembly housing of FIG. 20.
Figure 24:
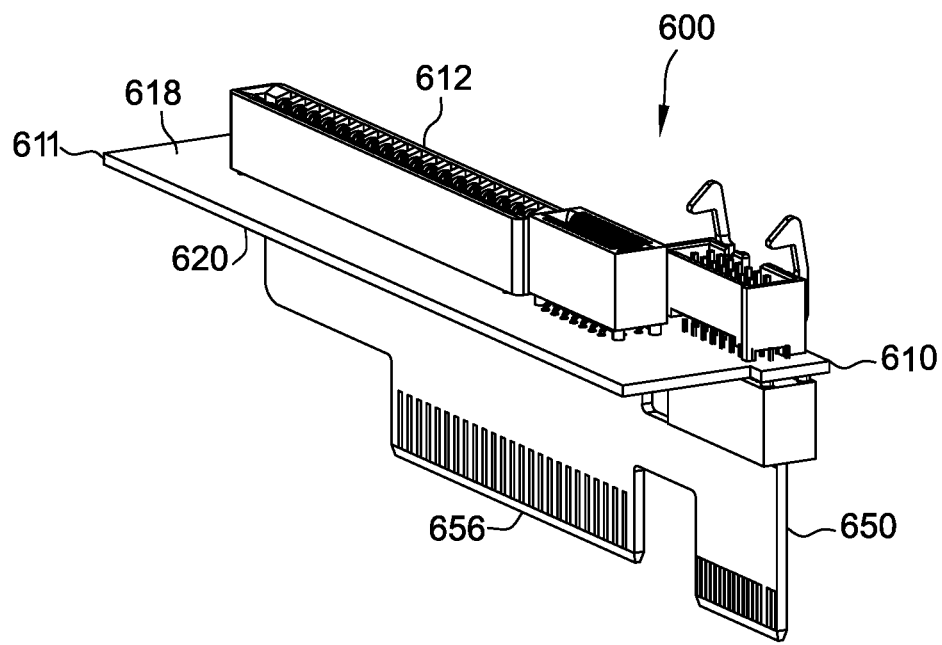
FIG. 24 illustrates a perspective view of the socket adapter and bus connections of the carrier module assembly of FIG. 20.
Figure 25:
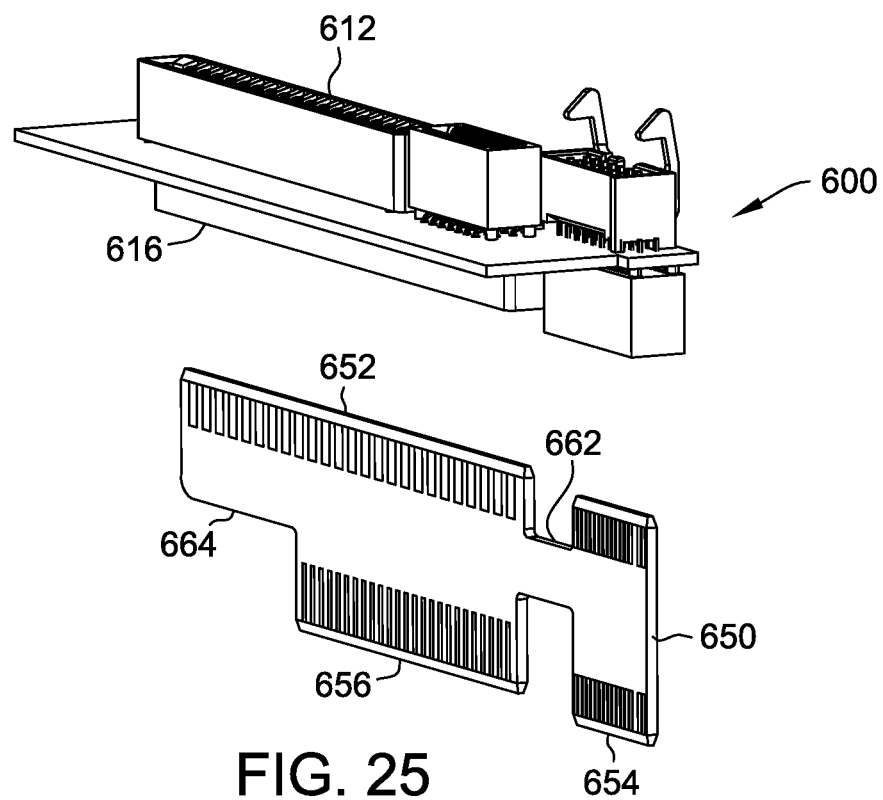
FIG. 25 illustrates an exploded view of the socket adapter and bus connections of the carrier module assembly of FIG. 24.

As best shown in FIGS. 21 and 22, the housing 604 includes a hollow body having a first surface 670 and an open second surface 672. The first surface 670 includes an opening 674 such that the socket adapter 612 of the carrier frame 610 can receive the rear connector 108 of the module 100. The open second surface 672 is generally hollow such that the bus port 654 and the second bus connector 656 are exposed and can be connected to the process socket adapter 360 or a pin connector 304 of a cable 302 upon mounting of the carrier module assembly 600 onto the backplate 740 as shown in FIG. 26.

The first surface 670 of the housing 604 includes a protrusion 676 extending from a side of the first surface 670. The protrusion 676 includes an inward surface 678 having a cylindrical mount 680 for mechanically securing the module 100 onto the housing 604. Upon connecting the module 100 to the carrier frame 610, the cylindrical mount 106 of the module 100 is aligned with the cylindrical mount 680 of the housing 604. A fastener can then be threaded through the cylindrical mount 106 of the module 100 and the cylindrical mount 680 of the housing 604 to removably attach the module 100 to the housing 604.

Figure 27:
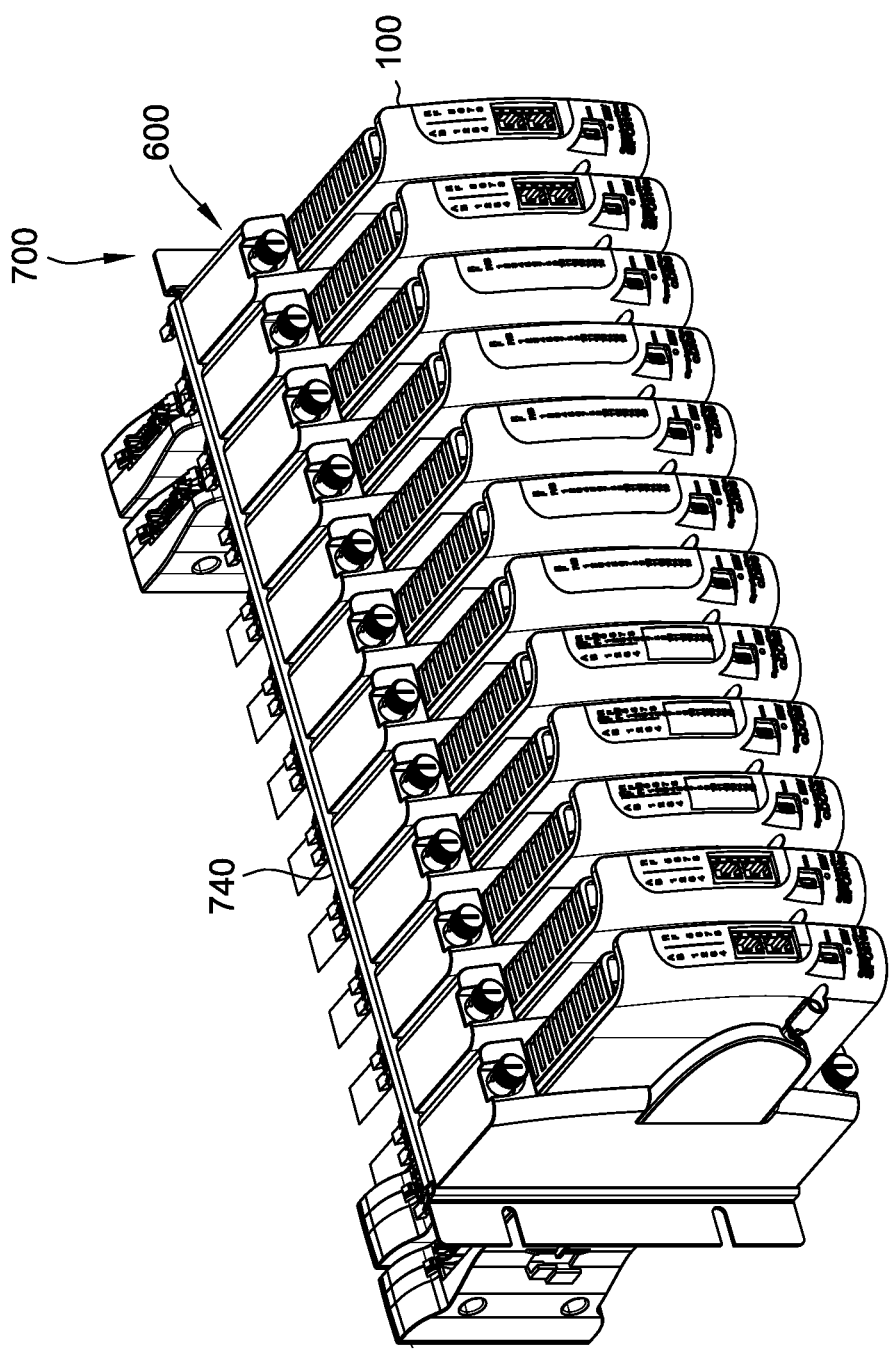

As shown in FIGS. 26 and 27, the carrier module assembly 600 can be attached to slots 720 of the rack 700. Instead of having to fasten the carrier module assembly to a control cabinet, the carrier module assembly 600 can be attached directly to the backplate 740 with fasteners extending through the housing 604. For each slot 720, the backplate 740 includes bores 722 for the fasteners to attach to the backplate 740.

As shown in FIGS. 15 and 26 and one or more modules 100 define a control system and together handle or process a plurality of inputs or a plurality of outputs. The one or more modules 100 can be I/O devices 100a or controllers 100b. The interface 110 of the I/O device 100a can include inputs and outputs, and the interface 110 of the controller 100b can include status indicators. The I/O device 100a and the controller 100b handling inputs and outputs. The inputs in some embodiments are analog inputs, digital inputs, thermocouple inputs or RTD inputs. The outputs in some embodiments are analog outputs or digital outputs. The inputs and outputs (I/O) are typically powered by sensors and control elements in the field. However, digital outputs in some embodiments are be powered by the one or more modules 100, such as when the digital outputs are used to energize relay coils. The field inputs and control outputs are routed to and from the control cabinet 300 or the rack 700 a module communication bus 790, which extends along all of the slots. Each module 100 includes a circuit board having a microprocessor, memory and other circuitry.

What is claimed is:

1. A carrier module assembly comprising:
   a module having an interface, a rear plug, and a side wall, the module comprising one of a controller device or an I/O device;
   a carrier frame having a socket adapter and a length, the socket adapter having a first side portion and a second side portion, the first side portion configured to receive the rear plug of the module; and
   a carrier riser having a length and a first bus connector configured to interdigitate with the second side portion of the socket adapter, and having one or more of a bus port and a second bus connector; wherein
   the carrier frame and the carrier riser defining a carrier subassembly which is configured to be inserted into a control cabinet which defines at least one slot; and
   the carrier module assembly comprises a length defined by the lengths of the carrier riser and carrier frame, wherein the length of the carrier subassembly enables the carrier module assembly to be located within the slot of the control cabinet.

2. The carrier module assembly of claim 1, further comprising a front plate configured to removably connect to the carrier frame, the front plate having an opening such that the opening provides access the interface, and the front plate abuts the interface of the module.

3. The carrier module assembly of claim 1, wherein the side wall of the module is configured to removably connect to the carrier frame and the carrier frame is connected to the carrier riser.

4. The carrier module assembly of claim 1, wherein the module has a length substantially equal to the length of the carrier frame.

5. The carrier module assembly of claim 1, wherein the bus port of the carrier riser is configured to interdigitate with a bus port of a backplate of the control cabinet.

6. The carrier module assembly of claim 1, wherein the second bus connector of the carrier riser is configured to interdigitate with a bus connector of a process socket adapter.

7. The carrier module assembly of claim 1, wherein the second bus connector of the carrier riser is configured to interdigitate with a pin connector of a cable.

8. The carrier module assembly of claim 1, wherein a total length of the carrier subassembly is in the range of 10 inches (25.4 cm) to 18 inches (45.72).

9. The carrier module assembly of claim 1 further comprising a housing, wherein the carrier frame and carrier riser are enclosed within the housing, wherein the housing includes a front surface and a side surface, wherein the bus connector of the module interdigitates with a slot disposed on the front surface of the housing.

10. The carrier module assembly of claim 9, wherein a support structure extends from the side surface, the support structure configured to removably secure the module to the housing.

11. A control cabinet comprising:
    a backplate having openings defining a plurality of slots;
    at least one of a controller device or a I/O device disposed within a first slot of the plurality of slots;
    at least one carrier module assembly disposed within a second slot of the plurality of slots, the at least one the carrier module assembly comprising:
    a module having an interface, a rear plug, and a side wall;
    a carrier frame having a socket adapter, the socket adapter having a first side portion and a second side portion, the first side portion configured to receive the plug of the module; and,
    a carrier riser having a first bus connector configured to interdigitate with the second side portion of the socket adapter, and having one or more of a bus port and a bus connector.

12. The control cabinet of claim 11, wherein each of the plurality of slots extend from a front end of the control cabinet to the backplate and has a length which also defines the length of the cabinet, wherein the at least one carrier module assembly is fastened to a bore of the slot.

13. The control cabinet of claim 11, wherein the carrier module assembly further comprises a housing, the housing enclosing the carrier riser and the carrier frame, the housing configured to fasten to the backplate.

14. A method of retrofitting a carrier module assembly to a control cabinet comprising:
    withdrawing a legacy device from a first slot of the control cabinet, the legacy device connected to a backplate of the control cabinet;
    inserting the carrier module assembly into the first slot, the controller assembly comprising:
    a module having an interface, a plug, and a surface;
    a carrier frame having a socket adapter, the socket adapter having a first side portion and a second side portion, the first side portion configured to receive the plug of the module; and,
    a carrier riser having a first bus connector configured to interdigitate with the second side portion of the socket adapter, and having one or more of a bus port and a bus connector; and,
    reconnecting the pin connector to the bus connector of the carrier riser of the carrier module assembly.

15. The method of claim 14, further comprising the step of removably fastening a front plate to a front surface of the carrier frame.

16. The method of claim 15, wherein the carrier riser has a length, the carrier riser and carrier frame defining a carrier subassembly, the carrier subassembly having a total length defined by the lengths of the connected carrier riser and carrier frame, wherein the carrier subassembly is configured and sized for insertion into the slot of the control cabinet, wherein the total length of the carrier subassembly is equal to a length of the legacy device.

17. The method of claim 14, wherein prior to inserting the carrier module assembly into the first slot, the carrier riser is removably connected to the carrier frame, and the carrier frame is removably connected to the module, and the carrier module assembly is assembled by inserting a second side portion of a socket adapter of the carrier frame into a bus connector of a carrier riser, inserting a rear plug of the module into a first side portion of the socket adapter of the carrier frame and connecting a front plate to the carrier frame.

* * * * *